(12) United States Patent
Paul

(10) Patent No.: US 8,238,136 B2
(45) Date of Patent: Aug. 7, 2012

(54) MEMORY BASED COMPUTATION SYSTEMS AND METHODS OF USING THE SAME

(75) Inventor: Bipul C. Paul, Sunnyvale, CA (US)

(73) Assignee: Toshiba America Research, Inc., San Jose, CA (US)

( * ) Notice: Subject to any disclaimer, the term of this patent is extended or adjusted under 35 U.S.C. 154(b) by 288 days.

(21) Appl. No.: 12/645,184

(22) Filed: Dec. 22, 2009

(65) Prior Publication Data

US 2010/0097837 A1    Apr. 22, 2010

Related U.S. Application Data

(60) Division of application No. 11/690,125, filed on Mar. 22, 2007, now Pat. No. 7,646,622, which is a continuation-in-part of application No. 11/277,299, filed on Mar. 23, 2006, now Pat. No. 7,570,505.

(51) Int. Cl.
  *G11C 17/06* (2006.01)
(52) U.S. Cl. .... 365/105; 365/94; 365/243; 365/189.011
(58) Field of Classification Search .................. 365/105, 365/94, 189.011, 243
  See application file for complete search history.

(56) References Cited

U.S. PATENT DOCUMENTS

| | | | |
|---|---|---|---|
| 4,608,672 A | 8/1986 | Roberts et al. | |
| 4,719,599 A | 1/1988 | Natsui et al. | |
| 4,884,238 A | 11/1989 | Lee et al. | |
| 4,920,516 A | 4/1990 | Tsuchimoto | |
| 5,429,968 A | 7/1995 | Koyama | |
| 6,404,693 B1 * | 6/2002 | Choi et al. | 365/230.03 |
| 6,449,192 B2 | 9/2002 | Otsuka | |
| 6,714,443 B2 * | 3/2004 | Ooishi | 365/171 |
| 6,741,488 B1 * | 5/2004 | Heightley et al. | 365/63 |
| 6,809,963 B2 * | 10/2004 | Kanai | 365/185.05 |
| 6,822,286 B2 | 11/2004 | Hsu et al. | |
| 7,038,934 B2 * | 5/2006 | Kang | 365/145 |
| 7,126,372 B2 | 10/2006 | Vadi et al. | |
| 7,283,409 B1 * | 10/2007 | Voogel et al. | 365/200 |
| 7,570,505 B2 * | 8/2009 | Paul | 365/94 |
| 7,646,622 B2 * | 1/2010 | Paul | 365/94 |
| 2004/0195589 A1 | 10/2004 | Hsu et al. | |

* cited by examiner

*Primary Examiner* — Pho M Luu

(74) *Attorney, Agent, or Firm* — Westerman, Hattori, Daniels & Adrian, LLP

(57) ABSTRACT

A high performance memory based computation system comprises an array of memory cells. Each memory cell stores a logic data corresponding to a chosen combination of inputs based on a specific logic function. For improved performance, the memory cell array can be divided into sub-blocks; and the sub-blocks can be serially disposed or juxtaposed. The performance of the memory based computation system can further be improved by removing the repeated memory cell rows, column, and/or sub-arrays.

20 Claims, 25 Drawing Sheets

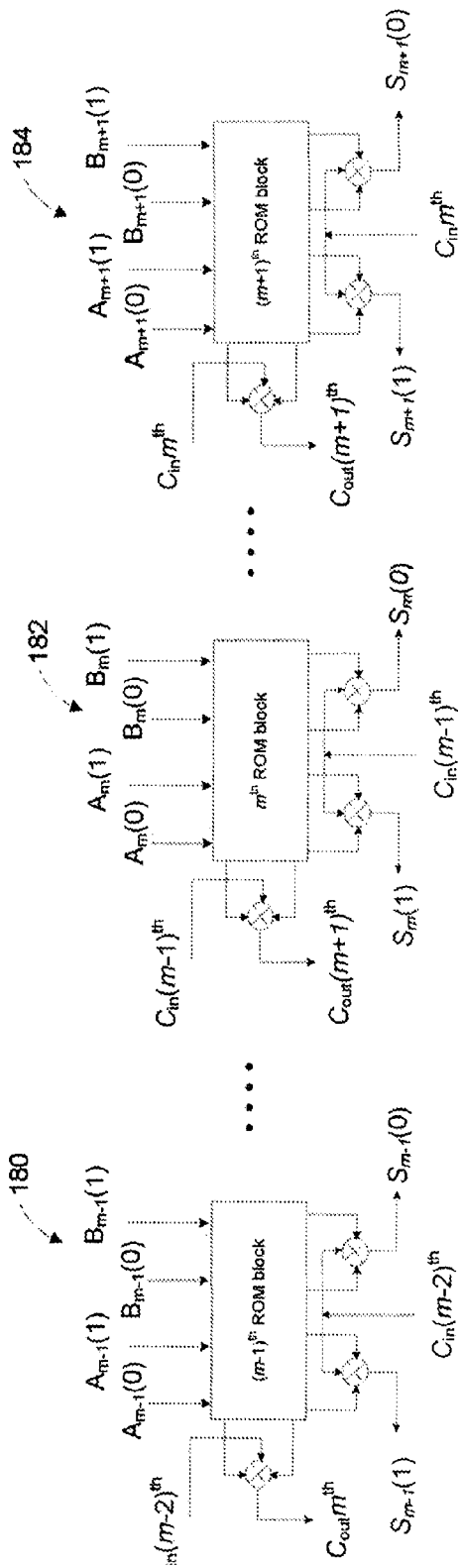
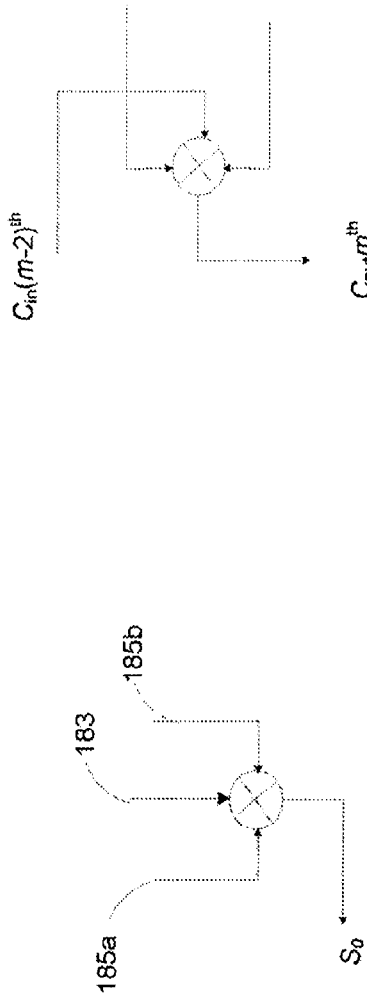
FIG. 12
FIG. 13a
FIG. 13b $$C'_m = C_{m,0} + C_{m,1}$$

$$R_i = \sum_{m=0}^{3} R_{m,i} \times C'_m$$

$$C'_{k=0,1} = \sum_{m=0}^{3} C_{m,k}$$

wherein *m* is the sub-block index.

  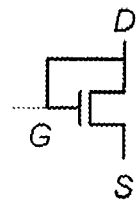
FIG. 38a      FIG. 38b      FIG. 38c
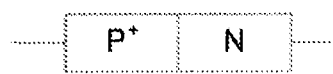 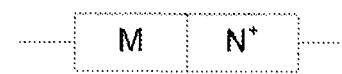 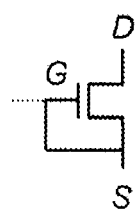
FIG. 39a      FIG. 39b      FIG. 39c
 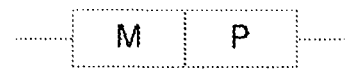 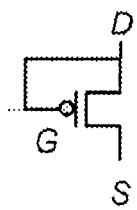
FIG. 40a      FIG. 40b      FIG. 40c
  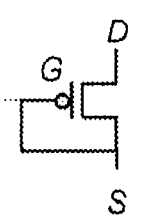
FIG. 41a      FIG. 41b      FIG. 41c

US 8,238,136 B2

MEMORY BASED COMPUTATION SYSTEMS AND METHODS OF USING THE SAME

CROSS-REFERENCE TO RELATED PATENT APPLICATIONS

This is a divisional application of U.S. patent application Ser. No. 11/690,125, filed on Mar. 22, 2007, now U.S. Pat. No. 7,646,622, which claims priority as a continuation in part under 35 U.S.C. 120 from US application "Memory Based Computation Systems and Methods for High Performance and/or Fast Operations" Ser. No. 11/277,299, now U.S. Patent No. 7,570,505, to Bipul C. Paul, filed Mar. 23, 2006, the entire disclosures of said priority applications are all incorporated herein by reference.

The subject matter of each of the following US patens, US patent applications; and published articles is incorporated herein by reference in its entirety.
1) U.S. Pat. No. 6,359,466, entitled Circuitry to Provide Fast Carry;
2) U.S. Pat. No. 5,926,036, entitled Programmable Logic Array Circuits Comprising Look Up Table Implementations of Fast Carry Adders and Counters;
3) U.S. Pat. No. RE35,977, entitled Look Up Table Implementation of Fast Carry Arithmetic and Exclusive-Or Operations;
4) U.S. Pat. No. 5,570,039, entitled Programmable Function Unit as Parallel Multiplier Cell;
5) U.S. Pat. No. 5,481,486, entitled Look Up Table Implementation of Fast Carry Arithmetic and Exclusive-OR Operations;
6) U.S. Pat. No. 5,359,548, entitled Floating-Point Arithmetic System Having Multiple-Input Addition and Subtraction Means;
7) U.S. Pat. No. 5,274,581, entitled Look-up Table Implementation of Fast Carry for Adders and Counters;
8) U.S. Pat. No. 5,245,562, entitled Accumulating Arithmetic Memory Integrated Circuit;
9) A Non Volatile Programmable Solid-Electrolyte Nanometer Switch, Shunichi Kaeriyame, et al., I.E.E.E. Journal of Solid-State Circuits, Vol. 40, No. 1, January, 2005;
10) Circuit Techniques for CMOS Low-Power High-Performance Multipliers, Issam Abu-Khater, et al., I.E.E.E., Journal of Solid-State Circuits, Vol. 31, No. 10, October 1996;
11) Look-Up Table-Based Pulse Shaping Filter Design, Myung-Soon Kim, et al., I.E.E.E., Electronics Letters, Vol. 36, No. 17, Aug. 17, 2000;
12) Design of a Radix-2-Hybrid Array Multiplier Using Carry Save Adder, M. Fonseca, et al., SBCCI, Proceedings of the 18th annual symposium on Integrated circuits and system design, Florianolpolis, Brazil, SESSION: Low power digital circuits design, Pages: 172-177, 2005, ISBN: 1-59593-174-0; and
13) A Novel Algorithm for Multi-Operand Logarithmic Number System Addition and Subtraction Using Polynomial Applications, I. Orginos, et al., I.E.E.E., in Proceedings of IEEE International Symposium on Circuits and Systems, (ISCAS'95), Vol. 3, pp. 1992-1995, Seattle, 1995.

TECHNICAL FILED OF THE DISCLOSURE

The technical field of the examples to be disclosed in the following sections relates, in general, to the art of systems and methods for logic computations, and more particularly, to the art of systems and methods for logic computations using memory cells.

BACKGROUND

Most current logic computations and logic operations are performed by logic circuits whose fundamental elements are logic gates. In certain applications unrelated to high performance applications, ROM (Read only Memory) based design has been employed. For example, ROM based design has been employed in Field Programmable Gate Array (FPGA) architectures, where basic logic gates like NAND, and NOR have been implemented. In addition, a similar approach has also been used to generate series of functions like logarithmic numbers and sinusoidal functions. However, these ROM based designs are mostly used for simple logic functions or operations, such as logic functions or operations with a low logic depth (logic depth being related to the maximum number of series-arranged processing elements in a logic circuit). One major reason for slower operation and higher energy consumption in such ROM based design in FPGA architectures, as well as other devices, is the use this approach for achieving reconfigurability. For this purpose, mainly basic gates are implemented using very small ROM structures (typically, 4 to 16 bit), which requires an increased number of transistors as compared to a conventional CMOS gate. Moreover, a ROM based design in general results in a larger area than its counterpart with conventional logic gates. Similarly, in the context of implementing series logic functions using ROM based designs, this typically involves the employment of large ROM sizes, which result in large delays (e.g., accessing the memory), increased area usage, and increased power usage as compared to designed with conventional logic gates.

Therefore, existing memory based designs for logic computations and/or logic operations do not relate to high-performance applications. There remains a continued need for improvements in high performance logic computations and logic operations.

SUMMARY OF THE DISCLOSURE

In an example of the invention, a logic device is disclosed herein. The logic device comprises: an array of read-only-memory cells each storing a data bit such that a collection of the data bits corresponding to a combination of a plurality of input signals that address the memory cells; and wherein each memory cell comprises at most one transistor.

In another example, a logic circuit is disclosed herein. The logic circuit comprises: an array of memory cells each having an NMOS or a PMOS transistor stored therein a digital bit of "0" or "1" such that an output of the memory cell array corresponds to a logic function of a collection of a plurality of input signals that are connected to the memory cells for accessing the memory cells.

In yet another example, a logic device is disclosed herein. The logic device comprises: an array of memory cells each having a diode; a first wordline connected to the cathodes of the diodes in a row of the array; a second wordline connected to the anodes of the diodes in said row of the array; a first set of bitlines connected to the anodes of the diodes whose cathodes are connected to the first wordline; a second set of bitlines connected to the cathodes of the diodes whose anodes are connected to the second wordline; wherein the diodes connected to the first wordline and the first set of bitlines store therein a digital bit "0;" and the diodes connected to the second wordline and the second set of bitlines store therein a digital bit "1" such that an output of the memory cell array corresponds to a logic function of a collection of a plurality of input signals that are connected to the memory cells for accessing the memory cells.

In still yet another example, a logic device is disclosed herein. The logic device comprises: an array of read-only-memory cells each storing a data bit such that a collection of the data bits corresponding to a combination of a plurality of input signals that address the memory cells; and wherein said memory cell array has substantially no identical rows or columns.

BRIEF DESCRIPTION OF DRAWINGS

FIG. 12 illustrates logic block diagrams of a series of memory blocks of the n-bits full adder in FIG. 11;

FIG. 13a and FIG. 13b are exploded diagrams of portions of the memory blocks in FIG. 12;

FIG. 38a through FIG. 41c schematically illustrate exemplary diodes that can be used for the memory cells illustrated in FIG. 2;

DETAILED DESCRIPTION OF SELECTED EXAMPLES

Figure 1:
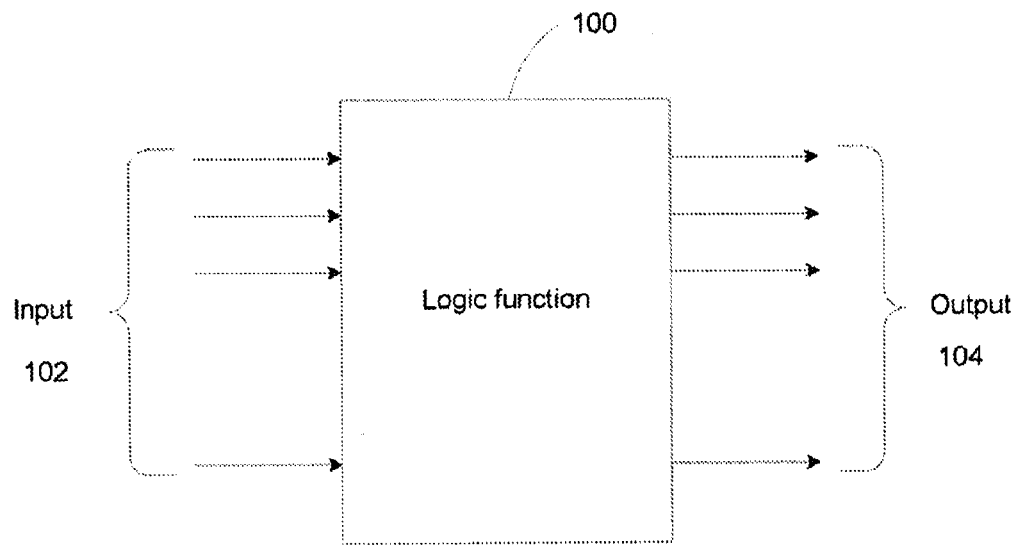
FIG. 1 is a block diagram of a memory-based computation system.

Disclosed herein are memory based computation systems and methods of using the systems for performing logic operations and computations and accomplishing high performance logic functions. In some examples of this disclosure, the memory cells can be a wide range of memory cells, including but not limited to, read-only-memory cells (hereafter ROM) and non-ROMs, such as programmable memory devices, as long as the memory devices are capable of storing digital information (e.g. "0" and "1"). It is noted that, in the following discussions, a ROM is referred to as a memory device that can only be read; and content stored in the ROM can not be changed or rewritten after the ROM is fabricated.

In some examples of this disclosure, the memory cells of the memory cells array in the memory based computation systems are NMOS, PMOS or combinations thereof for storing logic bits "0" and "1."

Some examples of this disclosure can be employed within high performance logic circuits. In some examples, preferred embodiments can be employed within Adders, Multipliers, Fast Fourier Transform (FFT) Compilers, Finite Impulse Response (FIR filters), etc. In this disclosure, high performance logic circuits can include, in some embodiments, circuits that perform two or more logical operations, and, in some other embodiments, circuits that perform three or more logical operations, and, in some preferred embodiments, circuits that perform five or more logical operations, and, in some preferred embodiments, circuits that perform ten or more logical operations. Moreover, in this disclosure, high performance logic circuits can include, in some embodiments, circuits that have a logic depth of two or more, and, in some other embodiments, circuits that have a logic depth of three or more, and, in some preferred embodiments, circuits that have a logic depth of five or more, and, in some preferred embodiments, circuits that have a logic depth of ten or more.

To achieve high performance, logic circuit can be divided into smaller blocks; each of the smaller blocks being implemented with Read Only Memory in which outputs corresponding to input combinations are pre-stored; and inputs to each of the respective smaller blocks being used as a respective address to access a respective Read Only Memory. The blocks are optimally sized large enough to inhibit slower performance and small enough to inhibit larger delay and power requirements.

The size of a memory cell array for a specific logic computation can be reduced, even though not required, by removing duplicate memory cell rows and/or columns in the array. Elimination of memory cells in rows, columns, and sub-blocks can be applied individually or in any combinations thereof. As such, accessing speed to the memory cells in the array can be improved; and the area of the memory cell array of the computation system can be reduced, which in turn, reduces power consumption.

Examples of this disclosure can be employed within a wide range of logic circuits, such as Adders, Multipliers, Fast Fourier Transform (FFT) Compilers, and Finite Impulse Response (FIR filters).

In the following, selected examples will be discussed with particular examples wherein the memory cells are ROMs, it will be appreciated by those skilled in the art that the following discussion is for demonstration purpose, and should not be interpreted as a limitation. Instead, other variations within the scope of this disclosure are also applicable.

Referring to the drawings, FIG. 1 is a block diagram of an exemplary memory-based computation system. In this example, memory-based computation system 100 comprises an array of memory cells, such as ROMs. For accomplishing a specific logic function, such as adder, FIR, ALU, and other logic functions, such that output signal(s) 104 is the specific function of input signal(s) 102, the memory cells each store a result for a specific combination input signals 102 based on a specific logic function. In operation, input signals are operated as addressing signals for memory cells; and a specific combination of the input signals causes a specific memory cell in the array to be addressed such that the information (bit) stored in this addressed memory cell is output from the output pins of system 100. Such output corresponds to the result of the specific combination of input signals based on the logic function.

Figure 2:
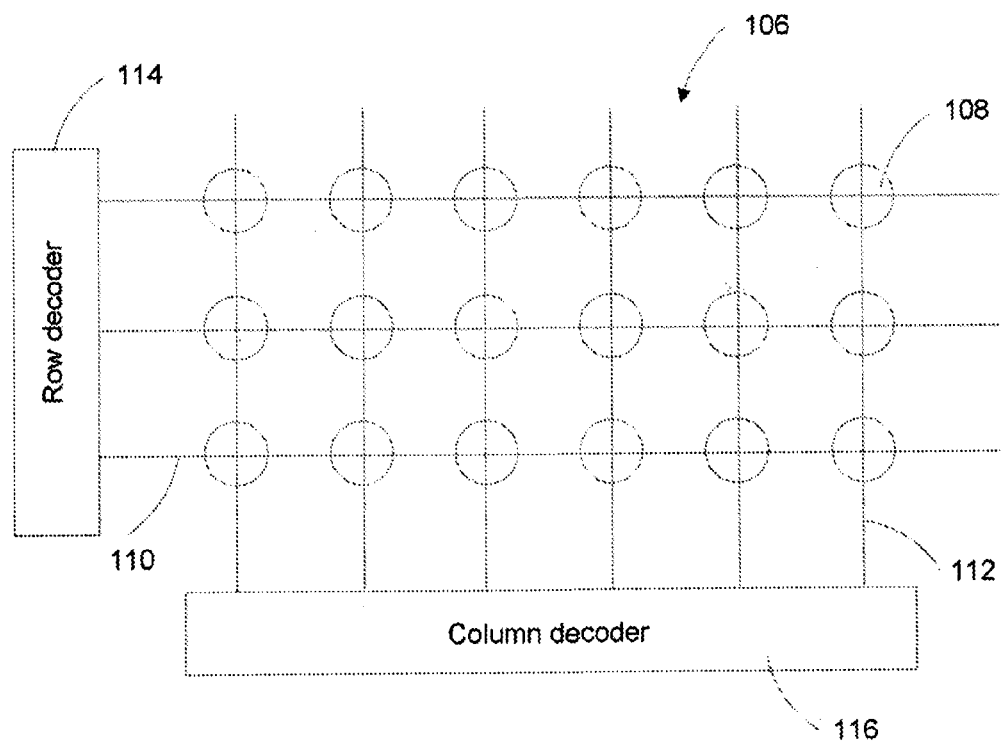
FIG. 2 schematically illustrates an array of memory cells of the memory-based computation system in FIG. 1.

FIG. 2 schematically illustrates an exemplary array of memory cells of the memory-based computation system (100) in FIG. 1. For simplicity and demonstration purposes, each memory cell in the memory cell array is represented by an open circle. As shown in FIG. 2, memory cell array 106 comprises memory cells, such as memory cells 108, which can be any types of memory cells, such as ROM. The memory cells are arranged into rows and columns in the array such that the memory cells in each row are connected to a wordline (e.g. wordline 110) for addressing the memory cells; and the memory cells in each column are connected to a bitline (e.g. bitline 112) for reading (outputting) the contents in the memory cells. In general, wordlines of the array are connected to row decoder 114 that is capable of generating proper addressing signals; and bitplanes are connected to column decoder 116 for generating proper outputs from read-outs from the memory cells.

Figure 3:
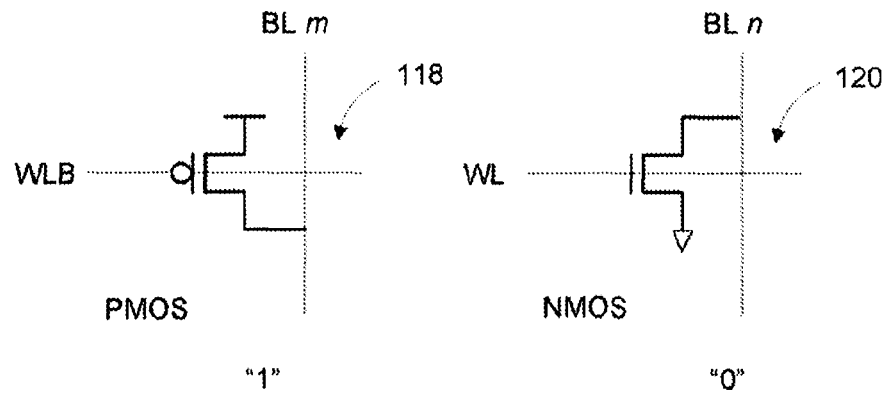
FIG. 3 schematically illustrates exemplary n-channel and p-channel MOS transistors (Metal-oxide-semiconductor-field-effect-transistor) for respectively storing bit "0" and bit "1" in the memory cell array as shown in FIG. 2.

As discussed above, the memories in the memory cell array can be any types of memory devices, examples of which can be NMOS and PMOS transistors, as schematically illustrated in FIG. 3. In this example, a wordline having a wordline signal WL is connected to the gate of NMOS (120); and a bitline BLn is connected to the source of the NMOS transistor. A wordline with a wordline signals WLB that is complementary to the wordline signal WL is connected to the gate of PMOS transistor 118; and a bitline BL m is connected to the source of PMOS 118. With this configuration, the PMOS transistor can be designated to store logic bit "1;" while the NMOS transistor can be designated to store logic bit "0." Voltage levels of the addressing wordlines and the corresponding logic states of the NMOS and PMOS transistors are schematically illustrated in FIG. 4.

Figure 4:
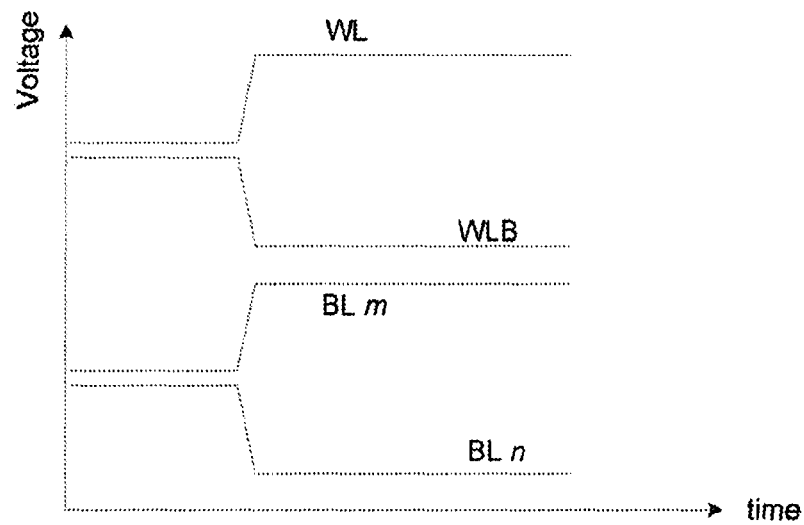
FIG. 4 schematically illustrates voltages levels of the NMOS and PMOS transistors in FIG. 4 in responses to different digital driving voltages.

Referring to FIG. 4, the PMOS is addressed when the addressing wordline WLB connected thereto has a low voltage. The addressed PMOS outputs a high voltage, representing logic "1," to the bitline BL m connected thereto such that the bitline BLm outputs a high voltage, representing logic "1." The NMOS is addressed when the addressing wordline WL connected thereto has a high voltage. The addressed NMOS outputs a low voltage, representing logic "0," to the bitline BL n connected thereto such that the bitline BLn outputs a low voltage, representing logic "0." It is noted that WL and WLB do not necessarily have separate addresses. When a ROW (e.g., WL) is enabled, it also enables WLB. Hence, bitlines connected to NMOS transistors in that ROW are discharged to '0' and bitlines connected to PMOS are charged to '1'.

Figure 5:
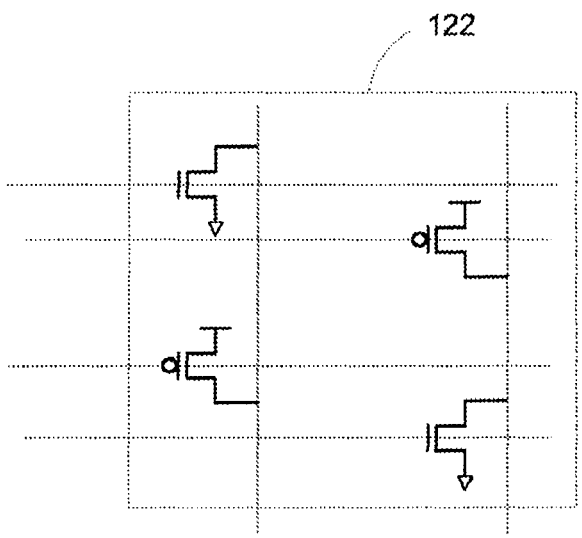
FIG. 5 schematically illustrates a diagram of an array of memory cells compose of the NMOS and PMOS transistors of FIG. 3.

As an example of this disclosure, each memory cell of the memory cell array in the memory based computation system comprises one transistor that is either PMOS 118 or NMOS 120; and the memory cell array comprises both NMOS and PMOS for storing logic "0" and logic "1" respectively. An exemplary such memory cell array (122) is schematically illustrated in FIG. 5.

In another example, memory cells of the memory cell array are either the NMOS or the PMOS; and the memory cell array is composed of only one of the NMOS and PMOS transistors, which is not illustrated in the figure. In other examples, non-silicon and/or other emerging non-volatile memory cells can be further employed as memory so as to further provide compact design while enabling faster and low power design. In this context, the MBC technique can efficiently utilize these advancements in memory technology, resulting in very high performance designs. By way of example, some illustrative emerging memories include non-silicon materials, inorganic materials, organic materials, single molecule materials, carbon nanotube memories, copper sulphide, phase change devices, cadmium sulphide and/or other emerging memories.

The memory based computation systems as discussed above can be implemented for accomplishing many types of logic operations, computations, and/or logic functions. Moreover, in this disclosure, high performance logic computations can include, in some examples, computations that have a logic depth of two or more, and, in some other examples, computations that have a logic depth of three or more, and, in some preferred examples, computations that have a logic depth of five or more, and, in some preferred examples, computations that have a logic depth of ten or more. Examples logic computations, operations, and logic algorithms in which examples of this disclosure can be implemented include, but not limited to, Adders, Multipliers, Fast Fourier Transform (FFT) Compilers, and Finite Impulse Response (FIR filters).

Figure 6:
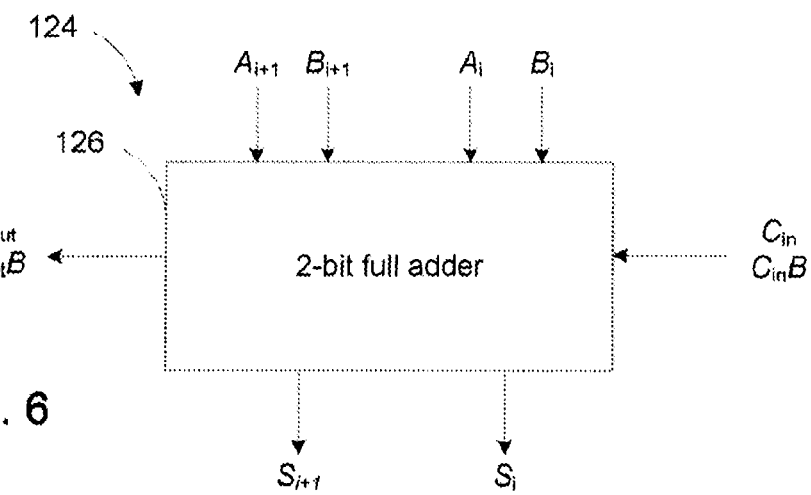
FIG. 6 is a diagram showing an exemplary 2-bit full adder based on memory cells shown in FIG. 3.

As an exemplary implementation, FIG. 6 schematically illustrates a portion of a 2-bit full adder that is capable of accomplishing adding input signals by accessing memory cells. Referring to FIG. 6, 2-bit adder 124 comprises an array of memory cells 126 with each memory cell comprising an NMOS or a PMOS transistor as shown in FIG. 3. In this example, $A_i$ and $B_i$ are the bits of input variables A and B, each having n bits. $A_{i+1}$ and $B_{i+1}$ are the $(i+1)^{th}$ bits of input variables A and B. $C_{in}$ is the signal of the carry bit for the adder; and $C_{in}B$ is the complementary signal of $C_{in}$. $C_{out}$ is the signal of the carry bit output from the adder; and $C_{out}B$ is the complementary signal of $C_{out}$. $S_i$ is the $i^{th}$ bit of the sum of input signals $A_i$, $A_{i+1}$, $B_i$, and $B_{i+1}$; and $S_{i+1}$ is the $(i+1)^{th}$ bit of the sum of input signals $A_i$, $A_{i+1}$, $B_i$, and $B_{i+1}$.

Figure 7:
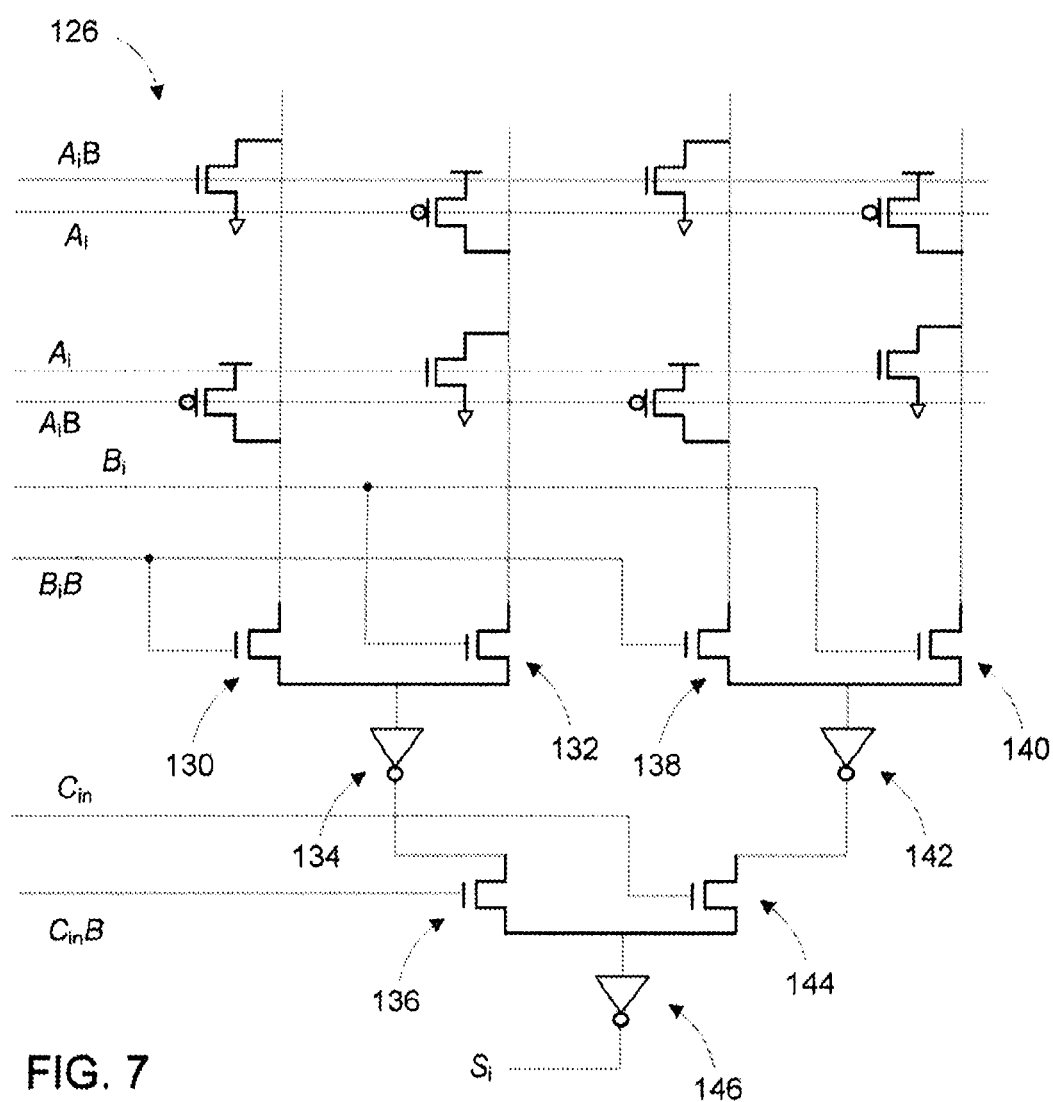
FIG. 7 schematically illustrates a portion of the 2-bit adder in FIG. 6 for generating the sum bit $S_i$.

A portion of an electronic layout diagram of the 2-bit adder in FIG. 6 is schematically illustrated in FIG. 7, wherein the illustrated portion is designated for generating sum bit $S_i$ of the sum of input variables $A_i$ and $B_i$. Referring to FIG. 7, the 2-bit adder comprises memory cell array 126 that is composed of the NMOS and PMOS as discussed above with reference to FIG. 3. A wordline carrying the input signal of $A_i$ is connected to the gates of PMOS memory cells in the first row that storing digital bit "1;" and its complement $A_iB$ (the complementary signal for $A_i$) is connected to the gates of the NMOS memory cells that storing digital bit "0". Similarly, in the second row, $A_i$ is connected to the gates of NMOS memory cells and $A_iB$ is corrected to the gates of PMOS memory cells. Signal $B_i$ is delivered to the gates of transistors 132 and 140 for addressing transistors 132 and 140, wherein the sources of transistors 132 and 140 are respectively connected to the bitlines in columns 2 and 4. Addressing signal $B_iB$, the complementary signal of $B_i$, is delivered to the gates of transistors 130 and 138 for addressing transistors 130 and 138, wherein the sources of transistors 130 and 138 are respectively connected to the bitlines in columns 1 and 3. The outputs of transistors 130 and 132 are connected to inverter 134; and the outputs of transistors 138 and 140 are connected to inverter 142. The output of inverter 134 is connected to the source of transistor 136, whose gate is connected to a select signal $C_{in}B$ (the complementary of carry bit signal $C_{in}$). The output of inverter 142 is connected to the source of transistor 144, whose gate is connected to a select signal $C_{in}$. The outputs of transistors 136 and 144 are connected to the input of inverter 146 that outputs the least-significant bit $S_0$ of sum of the input variables A and B.

Figure 8:
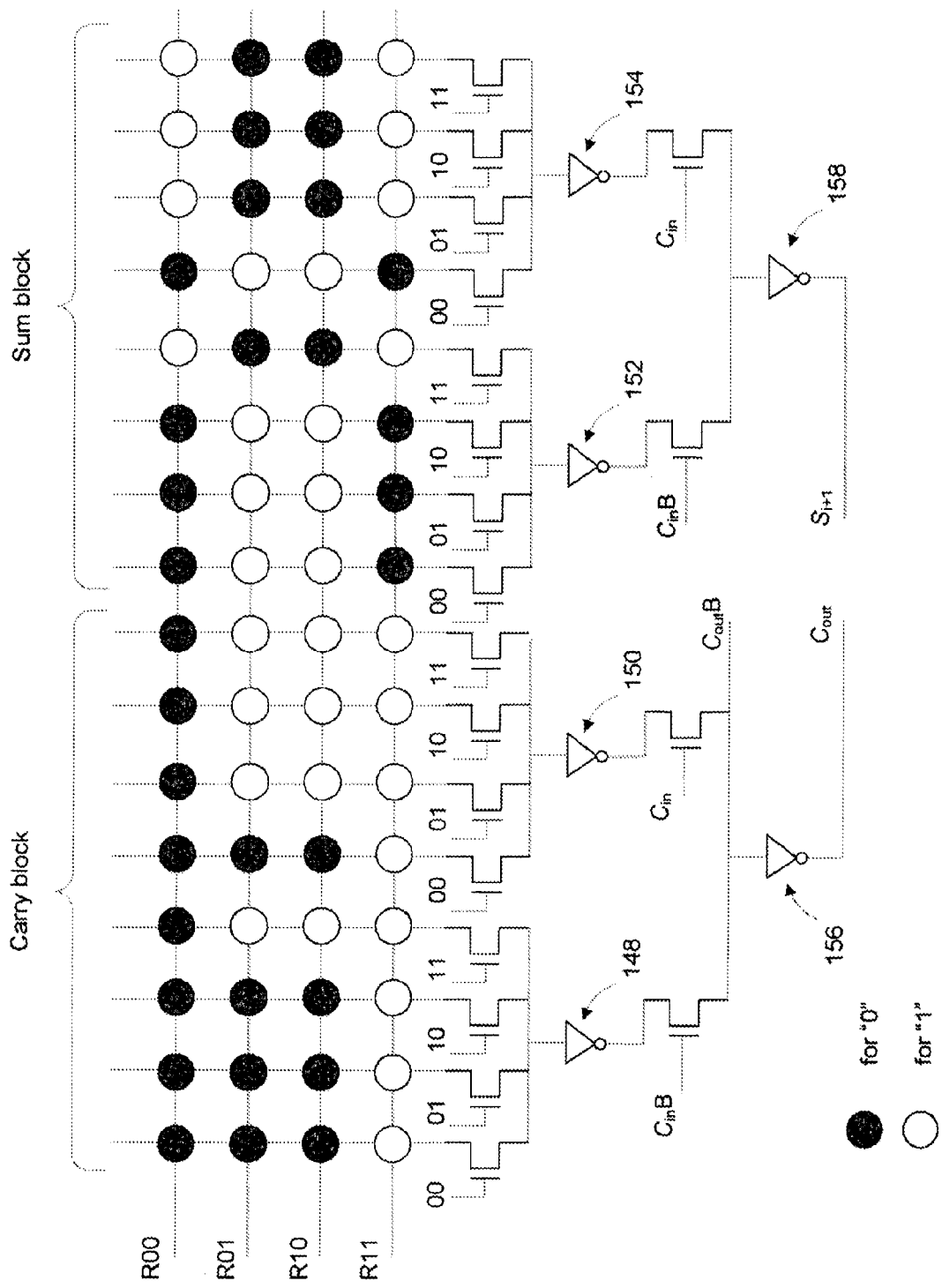
FIG. 8 schematically illustrates another portion of the 2-bit adder in FIG. 6 for generating the sum bit $S_{i+1}$ and the carry out bit $C_{out}$ of the 2-bit full adder.

FIG. 8 schematically illustrates another portion of the electronic layout diagram of the 2-bit full adder illustrated in FIG. 6, wherein the illustrated portion is designated for generating $S_{i+1}$ of the sum of input variables A and B and the carry bit $C_{out}$.

Referring to FIG. 8, the memory cell array is composed of two blocks—the carry block for the carry bit of the sum of the input variables A and B; and the sum block for the (i+1)th sum of the input variables A and B. For simplicity and demonstration purposes, NMOS transistors storing logic "0" in the array are represented by black circles; and PMOS transistors storing logic "1" in the array are represented by open circles. Different values of input variables A and B are loaded to different wordlines for addressing the memory cells. Specifically, R00 (representing $A_{i+1}=B_{i+1}=0$), R01 (representing $A_{i+1}=0$; and $B_{i+1}=1$), R10 (representing $A_{i+1}=1$; and $B_{i+1}=0$), and R11 (representing $A_{i+1}=1$; and $B_{i+1}=1$) are loaded to wordlines connected to the memory cells in the first, second, third, and fourth rows, respectively. Note that, the complementary signals of R00, R01, R10 and R11 are also generated. R00, R01, R10 and R11 are connected to the gates of NMOS transistors in their respective rows in the memory storing "0" and the complementary signals of R00, R01, R10 and R11 are connected to the gates of PMOS transistors in their respective rows in the memory storing "1" (not explicitly shown in FIG. 8). Each bitline is connected to a pass transistor whose gate is connected to one of the column select signals 00 to 11. The column signals are obtained using the column decoder with inputs Ai and Bi where 00 corresponds to $A_i=B_i=0$; 01 corresponds to $A_i=0$; and $B_i=1$; 10 corresponds to $A_i=1$; and Bi=0; and 11 corresponds to $A_i=1$; and $B_1=1$. The outputs of the pass transistors connected to the bitlines of the first four columns in the carry block are converged to the input of inverter 148. The output of inverter 148 is connected the source of a transistor whose gate is connected to the complementary carry bit signal $C_{in}B$ input into the adder. The output of this transistor is the complementary output carry bit $C_{out}B$.

The outputs of the transistors connected to the bitlines of the nest four columns in the carry block are converged to the input of inverter 150. The output of inverter 150 is connected to the source of a transistor whose gate is connected to the carry bit signal $C_{in}$ input into the adder. The output of this transistor and the output of the transistor connected to inverter 148 are connected to inverter 156 that outputs the carry bit $C_{out}$ of the adder.

The outputs of the transistors connected to the bitlines of the first four columns in the sum block are connected to the input of inverter 152. The output of inverter 152 is connected the source of a transistor whose gate is connected to the complementary carry bit signal $C_{in}B$ input into the adder. The outputs of the transistors connected to the bitlines of the second four columns in the sum block are connected to the input of inverter 154. The output of inverter 154 is connected the source of a transistor whose gate is connected to the carry bit signal $C_{in}$ input into the adder. The output of this transistor and the output of the transistor connected to inverter 152 are connected to inverter 158 that outputs the sum bit $S_{i+1}$ of the sum of the input variables A and B.

Figure 9:
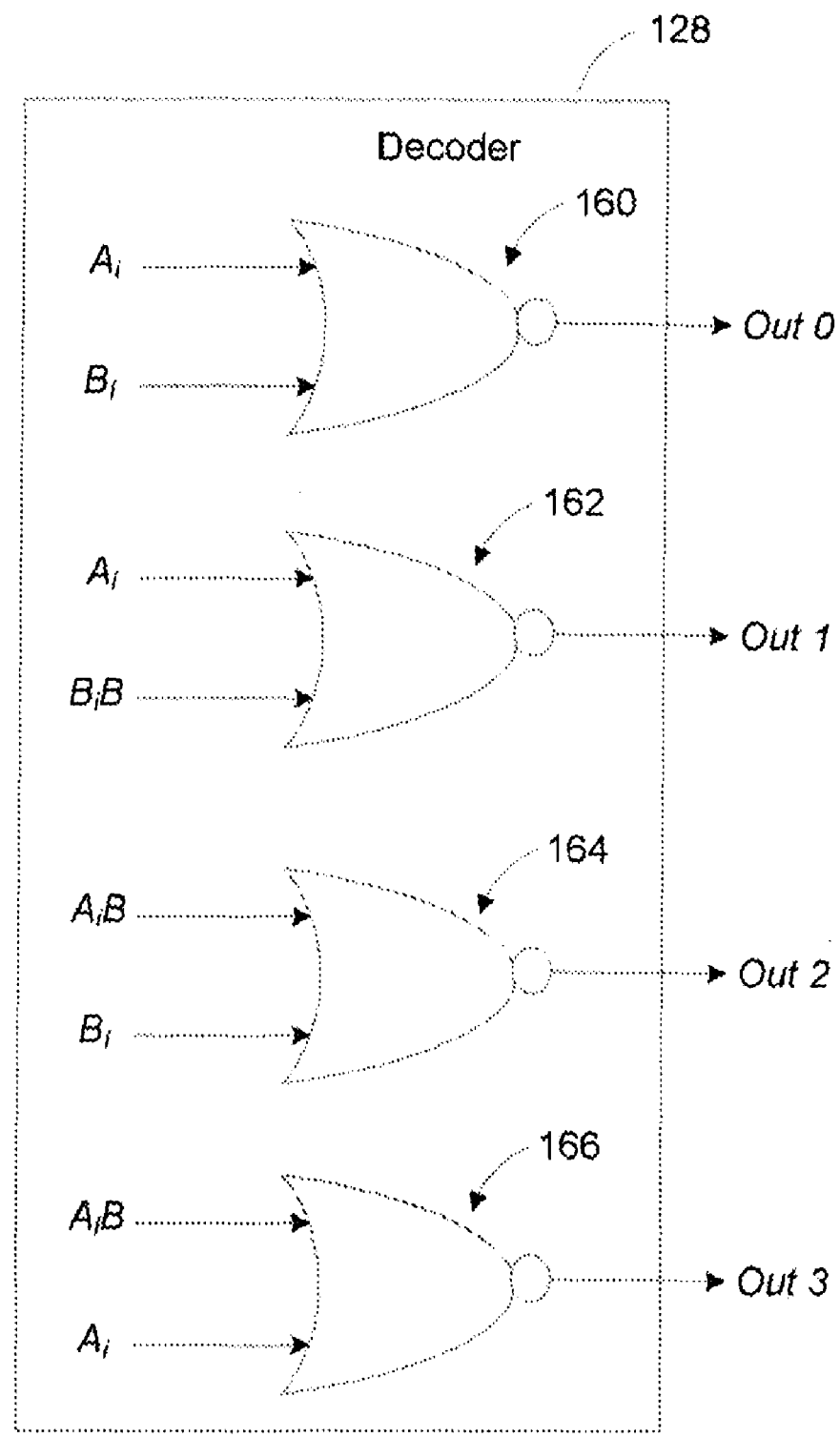
FIG. 9 schematically illustrates an exemplary decoder for use in the 2-bit full adder as illustrated in FIG. 8.

An exemplary decoder is schematically illustrated in FIG. 9. Referring to FIG. 9, row decoder 128 comprises logical NOR (not OR) gates 160, 162, 164, and 166. Signals $A_i$ and $B_i$, representing the $i^{th}$ bits of input variable A and B, are connected to the inputs of NOR gate 160. Signals $A_i$ and $B_iB$ that represents the complementary signal of the $i^{th}$ bit of input variable B are connected to the inputs of NOR gate 162. Signals $B_i$ and $A_iB$ that represents the complementary signal of the $i^{th}$ bit of input variable A are connected to the inputs of NOR gate 164. Signals $A_iB$ and $A_iB$ that represents the complementary signal of the $i^{th}$ bit of input variable A are connected to the inputs of NOR gate 166. The outputs of the NOR gates are then used for column select as 00, 01, 10, and 11, respectively. The same decoder can be used to generate R00, R01, R10 and R11 when Ai+1 and Bi+1 are used as inputs.

Figure 10:
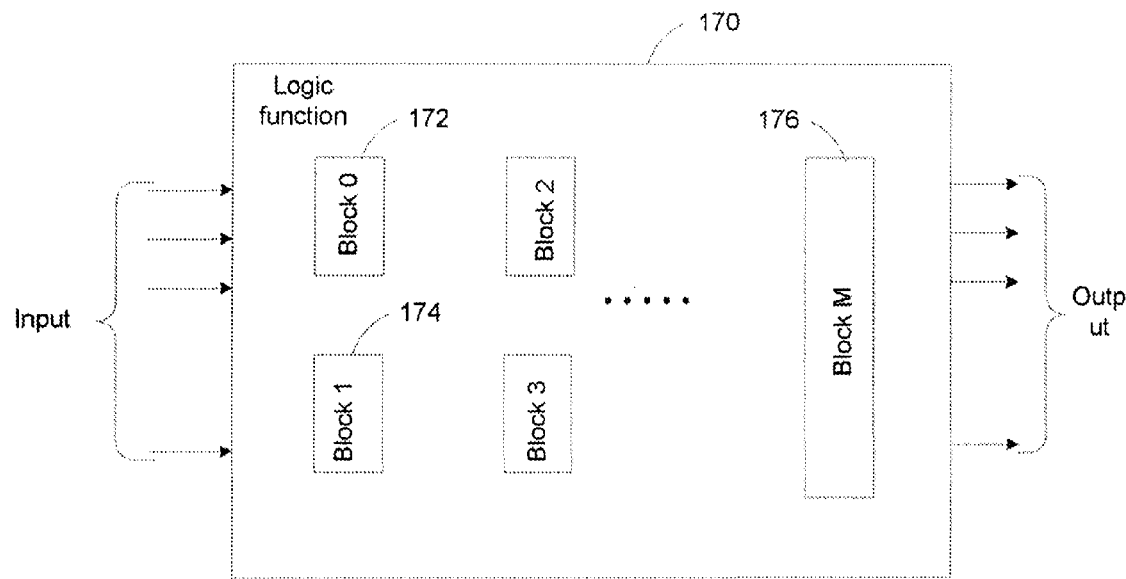
FIG. 10 is a diagram illustrating a memory-based computation system with dividing sub-modules for performing a logic function having a logic depth larger than 1.

For improving the performance in complex logic computations, the desired function to be accomplished by memory cell array(s) can be divided into multiple smaller functional sub-blocks, as schematically illustrated in FIG. 10. Referring to FIG. 10, memory based computation system 170 is designated for accomplishing a specific logic function that may have a logic depth higher than 1, such as 2 or higher, 3 or higher, 5 or higher, and 10 or higher. System 170 comprises a number of functional sub-blocks—sub-block 0 172, sub-block 1 174 through sub-block M 176, wherein M is an integer that is 2 or larger, such as 3 or larger, 5 or larger, and 10 or larger. Each function sub-block comprises an array of memory cells as discussed above, in particular, the memory cells comprising NMOS and PMOS transistors such that each function block is capable of accomplishing a specific operation, a computation, or an algorithm. The size of each memory block can be selected to ensure that desired results are achieved. In this regard, such a selection preferably takes into account that: a) if block size is too small, a slower performance can be incurred than with, e.g., a regular logic; and b) if block size is too large, exceptionally large memory resources are required, resulting in larger delay and power requirements.

Figure 11:
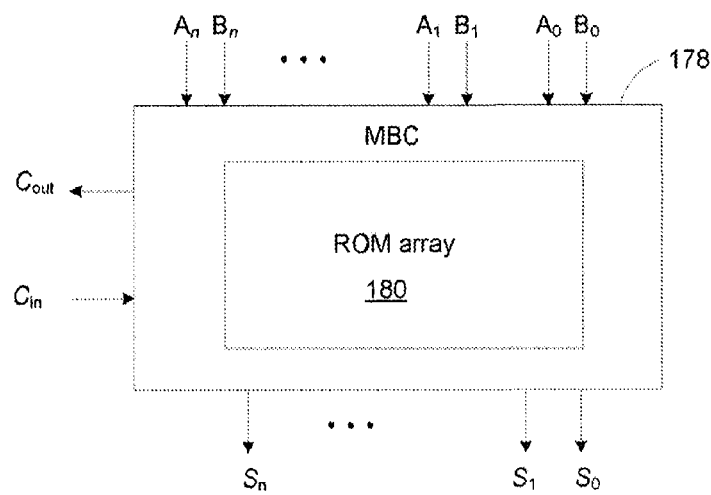
FIG. 11 is a block diagram illustrating an exemplary memory-based n-bits full adder.

As an example, the memory based computation system as illustrated in FIG. 10 can be implemented to accomplish an n-bits carry selected adder (CSA), as illustrated in FIG. 11. Referring to FIG. 11, the memory based CSA 178 comprises a memory cell array 180. The memory cells each store a logic value of a combination of input variables A and B, each having n-bits. The combination of input signals address proper memory cells so as to obtain sum bits $S_0$ to $S_n$, as well as carry bits $C_{Out}$. Exemplary logic diagrams of sub-blocks used in accomplishing the n-bit carry select adder in FIG. 11 are schematically illustrated in FIG. 12.

Referring to FIG. 12, the functional blocks, such as $(m-1)^{th}$ block, $m^{th}$ block, and $(m+1)^{th}$ block, are provided with each sub-block being capable of summing a two-bits of A and B (e.g. $A_{i+1}$, $B_{i+1}$; and $A_i$, $B_i$). Bits of variables A and B are respectively input to the functional sub-blocks, as shown in the figure. For example, assuming each input variable A and B having 32-bits, 16 sub-blocks (e.g. m is from 0 to 15) can be used to accomplish the 32-bits carry selected adding function. Assuming that m is 4 (the fifth sub-block), then the $m^{th}$ sub-block sums $A_9$ (the $9^{th}$ bit of variable A), $A_{10}$ (the $10^{th}$ bit of variable A), $B_9$ (the $9^{th}$ bit of variable B); and $B_{10}$ (the $10^{th}$ bit of variable B). The obtained carry bit from a block is transferred to the next block as input carry bit $C_{in}$. For example, the obtained carry bit from the $(m-1)^{th}$ block is delivered to the $m^{th}$ block; and the carry bit obtained from the $m^{th}$ block is delivered to the $(m+1)^{th}$ block. Each block outputs two bits value of the sum of the input variables A and B. For example, the $(m-1)^{th}$ block outputs the $S_{m-1}(0)$ and $S_{m-1}(1)$; the $(m)^{th}$ block outputs the $S_m(0)$ and $S_m(1)$; and the $(m+1)^{th}$ block outputs $S_{m+1}(0)$ and $S_{m+1}(1)$. FIG. 13a and FIG. 13b better illustrate operations on signals outputs from each functional modules. In the above drawings, the symbol of open circle with a cross inside represents a multiplexer. For example, the multiplexer in FIG. 13 is connected to three inputs 183, 185a, and 185b, and an output $S_0$. Input 183 is a select signal connected to the $C_{in}$; and the other two inputs 185a and 185b are connected to the column selectors. Specifically, input 185a is connected to inverter 134 in FIG. 7; while input 185b is connected to inverter 142 in FIG. 7.

Figure 14:
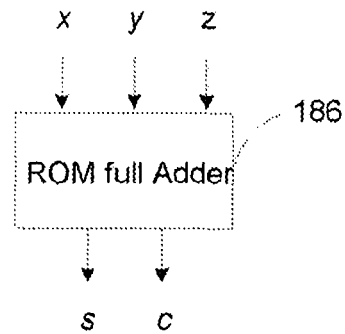
FIG. 14 is logic diagram of an exemplary memory based full adder capable of adding three inputs.
Figure 15:
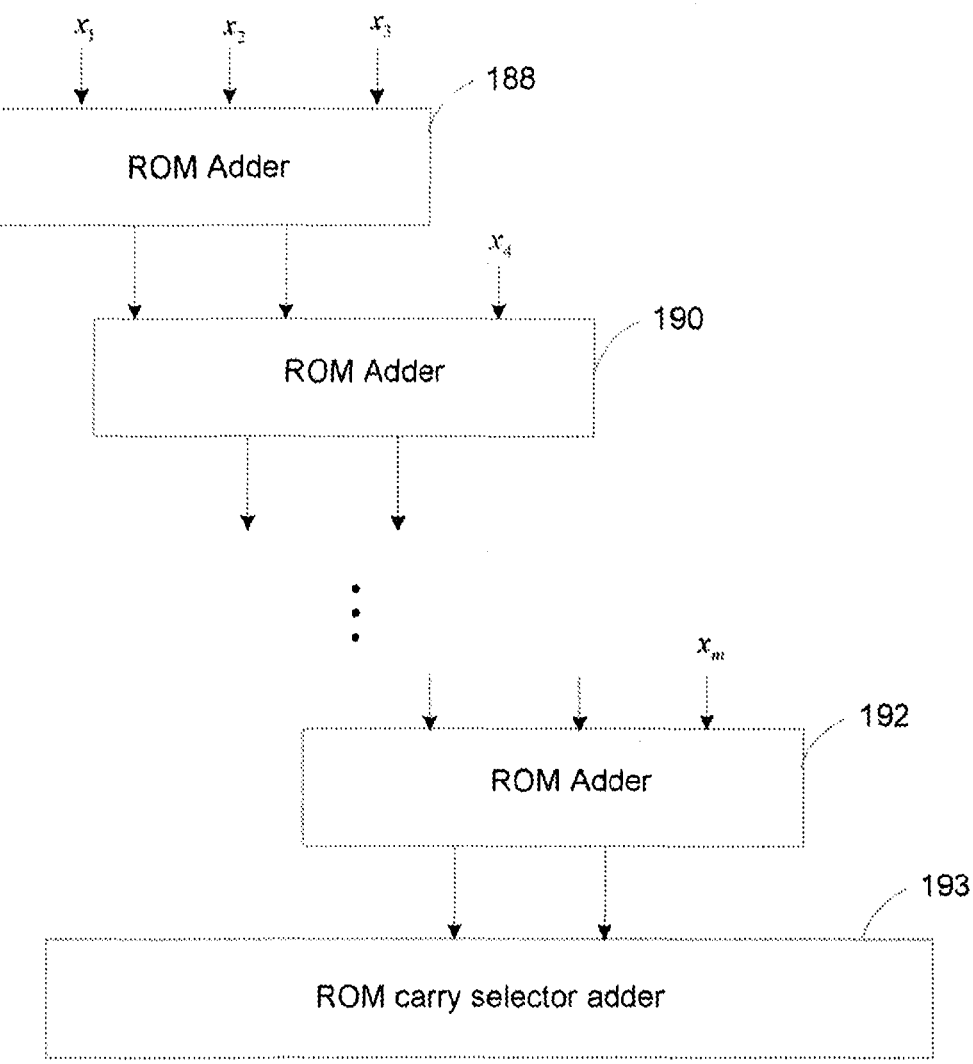
FIG. 15 is logic diagram of an exemplary memory based adder capable of adding m inputs.

As another example, a ROM full adder capable of adding three or more input variables (conventionally known as carry save adder), which employs memory based computation is schematically illustrated in FIGS. 14 and 15. Referring to FIG. 14, ROM full adder 186 provides three inputs for accepting input variables x, y, and z each having n-bits. The ROM full adder outputs the n-bits sum s and n+1 bits carry c for the input variables x, y, and z. The ROM full adder (186) can be implemented in a computation system capable of computing m numbers of input variables, wherein m is an integer larger than 3, such as 5 or higher, 10 or higher, 15 or higher, and 20 or higher with each input variable having n-bits. An exemplary architecture of such computation system is schematically illustrated in FIG. 15.

Referring to FIG. 15, the system comprises a plurality of sub-adder blocks 188, 190, and 192, as well as ROM carry selector adder 193. Each sub-block is capable of summing three input variables each having n-bits. The outputs of the last sub-block are connected to ROM carry selector 193 that sums the final sum and carry output from 192. The carry select adder (193) can be the same as discussed above with reference to FIG. 11, which will not be detailed herein.

Figure 16:
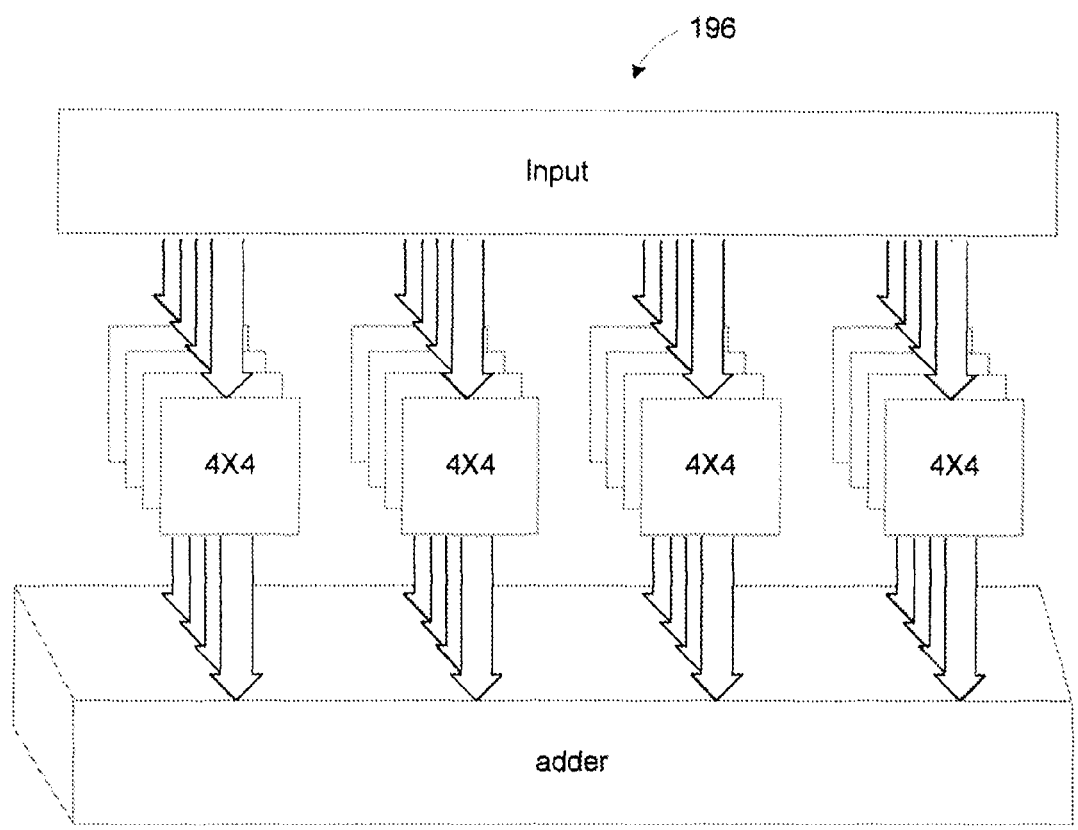
FIG. 16 is logic diagram of an exemplary memory based 16×16 multiplier.

As yet another example, FIG. 16 schematically illustrates a logic circuit implementation, in the case of a 16×16 multiplier. In this example, sixteen 4×4 multipliers are implemented directly using an MBC technique. Then, the outputs are added using a Carry Save Adder of length 28 and order 5, which is implemented using the architecture proposed above. In this approach, a performance improvement of approximately 3× can be achieved. Once again, this is merely one illustrative and non-limiting example implementing a multiplier using an MBC technique. In other examples, the memory block size and the adder combination can further be optimized to, e.g., improve performance, to reduce power and/or to reduce area.

Figure 17:
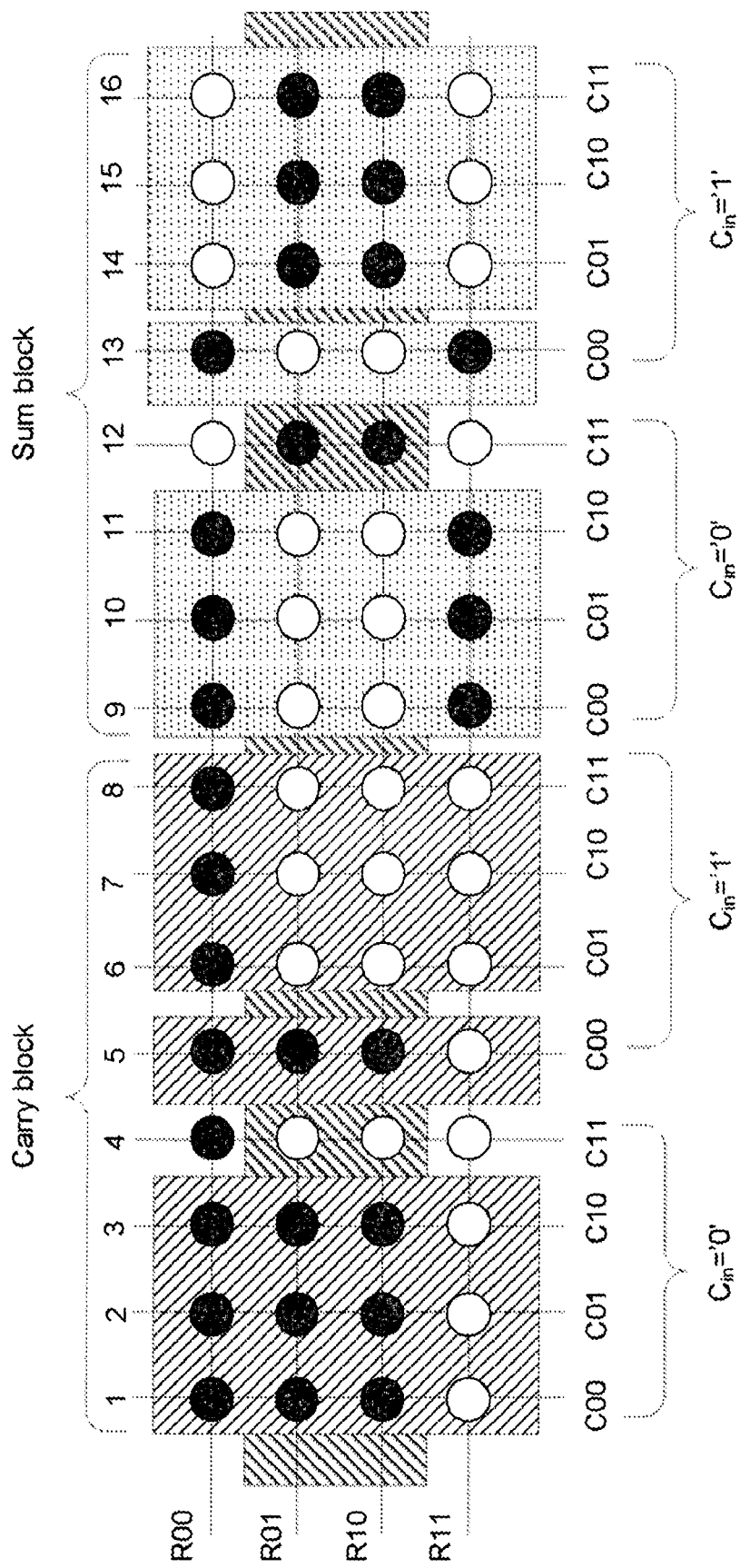
FIG. 17 is a diagram illustrating an exemplary memory architecture of memory based 2-bits adder.

In implementations of memory-based computations as discussed above, the memory cell arrays of the computation systems may exhibit repeated rows and/or columns, an example of which is illustrated in a 2-bit adder as illustrated in FIG. 17, which was previously presented in FIG. 8. Referring to FIG. 17, the second row (R01) and the third row (R10) having identical memory cell configurations—meaning that the locations of the memory cells storing logic "1" and logic "0" follow the same pattern. Similarly, columns 1, 2, 3, and 5 in the carry block have the same memory cell pattern; and columns 6, 7, and 8 of the carry block have the same pattern. In the sum block, columns 9, 10, 11, and 13 have the same pattern; and columns 12, 14, 15, and 16 have the same pattern. In terms of information storage, each group of repeating columns (rows) can be represented by one column (row) without losing the information stored in the memory cell array, but significantly reducing the size of the memory cell array. Moreover, reducing the total number of memory cells can significantly decrease the accessing time of the remaining memory cells.

Figure 18:
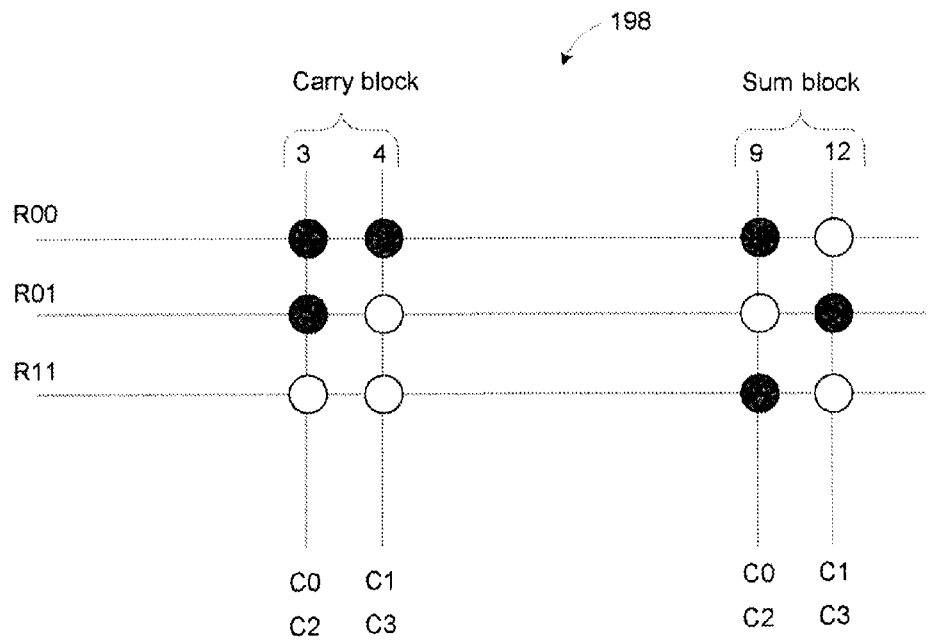
FIG. 18 is a diagram showing a memory architecture derived from that in FIG. 17 with redundant memory rows and columns being removed.
Figure 19:
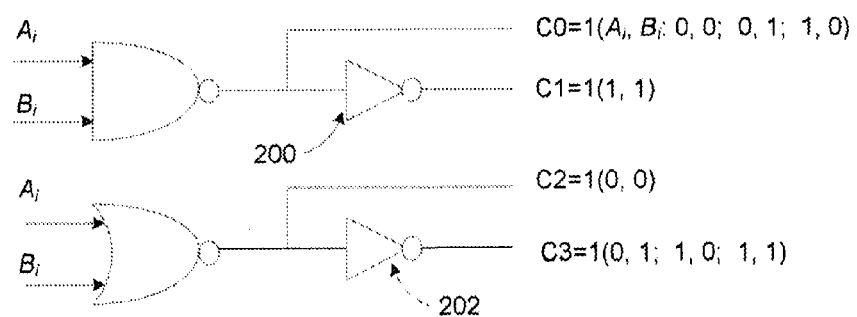
FIG. 19 is a logic diagram of a column decoder for used in the memory cell array in FIG. 18.

A memory cell array derived from the memory cell array in FIG. 17 by removing the repeating memory cells is schematically illustrated in FIG. 18. It can be seen in FIG. 18 that, the carry block and sum block each comprise two columns and three rows substantially without repeating memory cell patterns. The reduced memory cell array in FIG. 18 stores the same amount of logic information as the memory cell array in FIG. 17. Specifically, the 64 bits memory cell array in FIG. 17 is reduced to a memory cell array with 12 bits a reduction by more than 5 times. As an alternative feature, if the memory cells in a row or column store the same logic data, such identical row or column can be replaced or represented by a single logical bit. FIG. 19 schematically illustrates the logical diagram of the column decoder for use in the memory cell array in FIG. 18.

Referring to FIG. 19, input variables $A_i$ and $B_i$ correspond to the two bit adder block shown in FIG. 6. $A_i$ and $B_i$ are input to a NAND gate and a NOR gate. The NAND gate outputs $C_0=1$ when the input variables are 0, 0; 0, 1; or 1, 0. The output of the NAND gate is also input to inverter 200 so as to obtain $C_1$ when the input variables are 1 and 1. The NOR gate outputs $C_2=1$ when the input variables are 0, 0. The output of the NOR gate is also input to inverter 202 so as to obtain $C_3$ when the input variables are 0, 1; 1, 0; or 1, 1. Note that C0 and C1 correspond to the column select when $C_{in}=0$; and C2 and C3 correspond to column select when $C_{in}=1$ (see FIG. 17).

Figure 20:
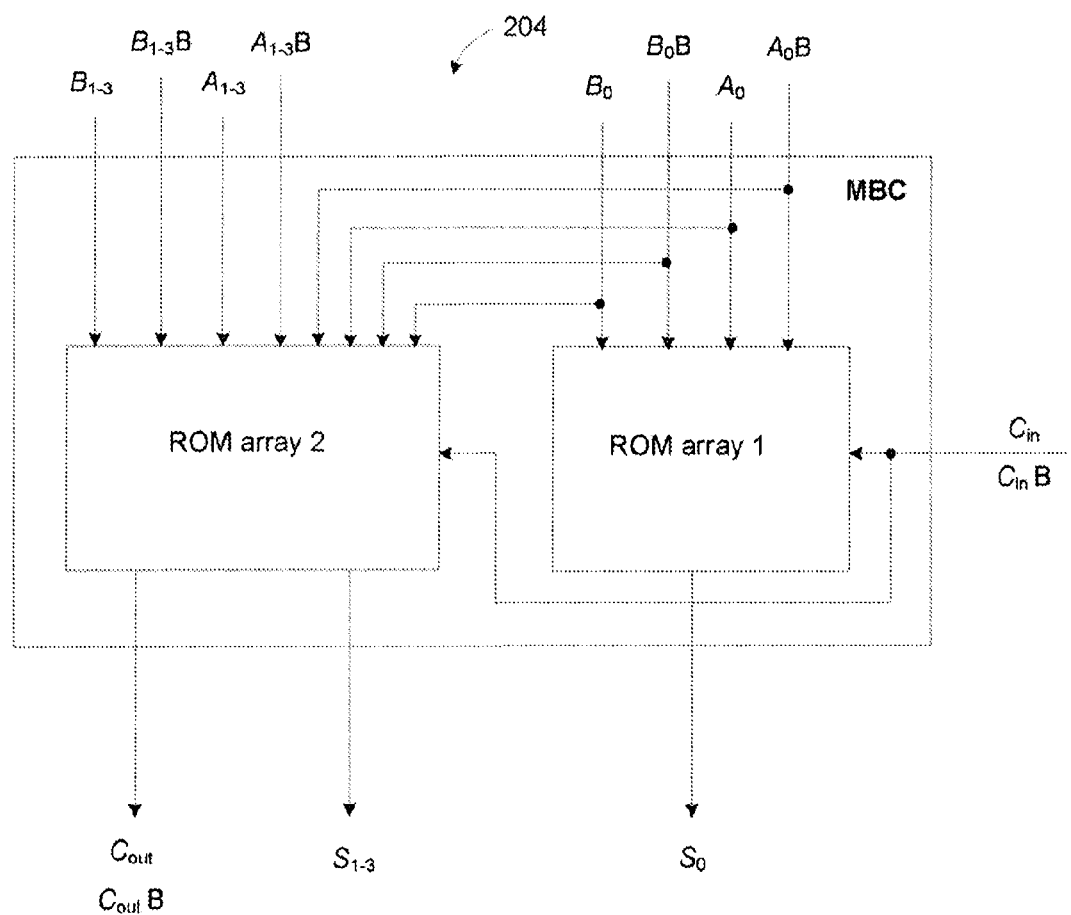
FIG. 20 is a diagram illustrating an exemplary memory architecture of memory based 4-bits adder.
Figure 21:
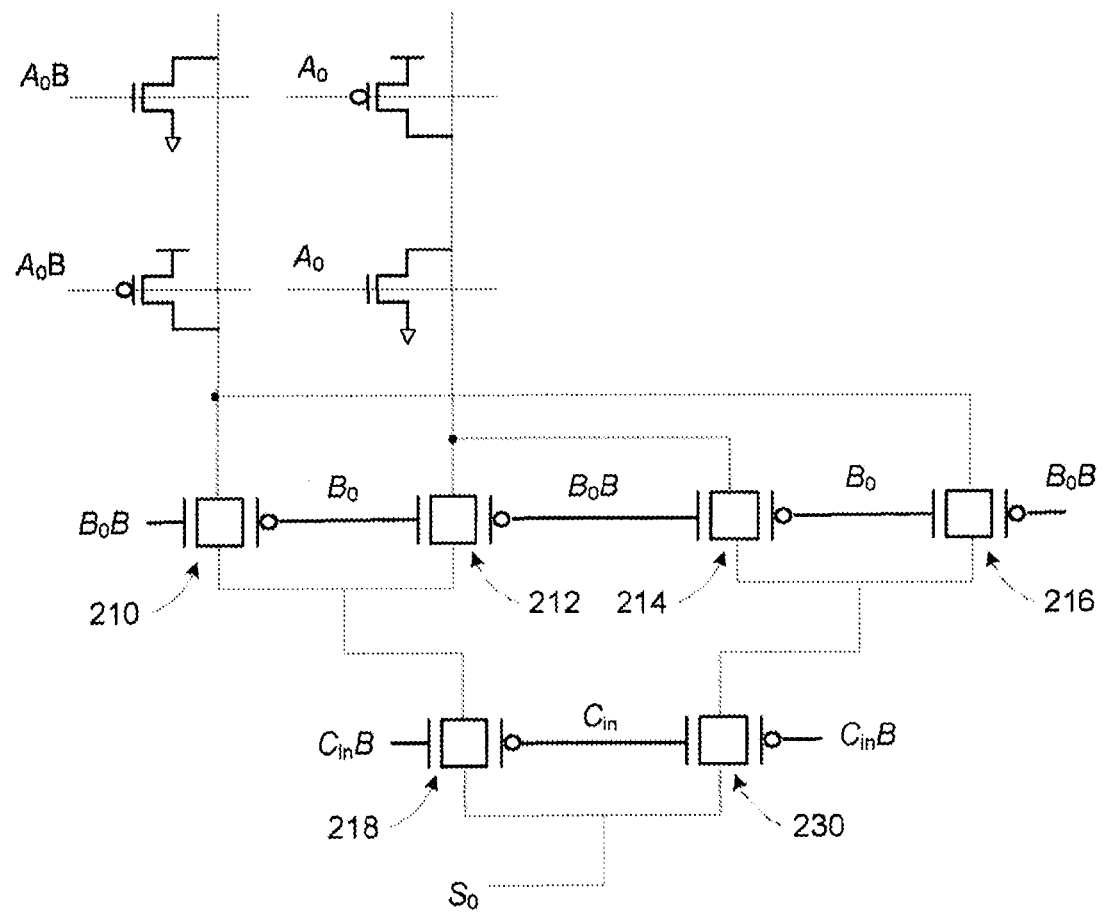
FIG. 21 illustrates an exemplary memory structure of the memory block 1 in the 4-bits adder in FIG. 20.

An example implementation of a 4-bits adder using this technique is demonstrated in FIG. 20-29c, which may reduce the memory area by ~23% while improving the performance by ~40% compared to the conventional Carry Select Adder design Referring to FIG. 20, 4-bits MBC adder, 204 in this example, comprises memory array 1 and memory array 2. The memory array 1 can be used for obtaining the least-significant bit $S_0$ of the sum of input variables A and B. The memory array 2 can be used for obtaining the remaining bits $S_{1-3}$ of the sum of input variables A and B. as well as the carry bit $C_{out}$ and it complementary signal $C_{out}B$. An exemplary architecture of the memory block 1 in FIG. 20 is schematically illustrated in FIG. 21.

Referring to FIG. 21, memory cells are connected to, and thus, addressed by wordlines, A0 and A0B. The memory cells are also connected to bitlines from which the logical bits stored in the memory cells can be read. As shown in the figure, signals $A_0B$ and $A_0$ are delivered to the gates of transistors (NMOS and PMOS) of the memory cells. The bitlines are connected to transmission gates 210 and 212). The gates of the transistors 210 and 212 are connected to signals of $B_0B$ and $B_0$, respectively. The outputs of the transistor assemblies 210 and 212 are delivered to the input of transistor assembly 218. The bitlines are also connected to transistor assemblies 214 and 216, wherein the gates of the transistors 214 and 216 are respectively connected to signals of $B_0B$ and $B_0$. The outputs of the transistor assemblies 214 and 216 are delivered to the input of transistor assembly 230. The outputs of transistor assemblies 218 and 230 are combined together to output the least-significant sum bit $S_0$.

Figure 22:
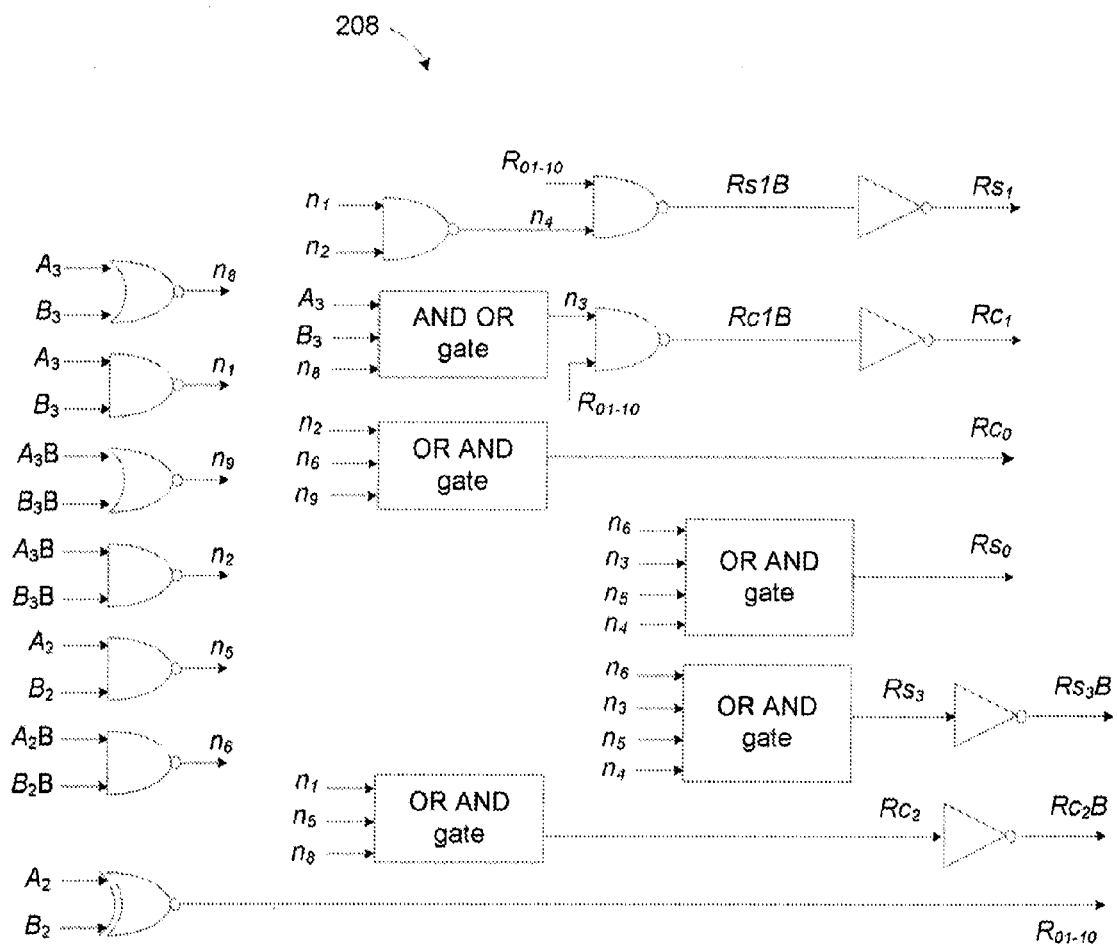
FIG. 22 illustrates an exemplary row decoder of the 4-bits adder used in ROM array 2 as shown in FIG. 20.

FIG. 22 schematically illustrates an exemplary architecture of the row decoder for the ROM array 2 in FIG. 20. In this particular example, input signals include $A_3$ (the $3^{rd}$ bit of variable A), $A_3B$ (the complementary signal of $A_3$), $B_3$ (the $3^{rd}$ bit of variable B), $B_3B$ (the complementary signal of $B_3$), $A_2$ (the $2^{nd}$ bit of variable A), $A_2B$, $B_2$ (the $2^{nd}$ bit of variable B), and $B_2B$; and output signals include $Rc_0$ (the $0^{th}$ bit of the carry signal) $Rc_1$ (the $1^{st}$ bit of the carry signal), $Rc_1B$ (the complementary signal of $Rc_1$), $Rc_2B$ (the complementary signal of $Rc_2$), $Rs_0$ (the $0^{th}$ bit of sum 5), $Rs_1$ (the $1^{st}$ bit of sum 5), $Rs_1B$ (the complementary signal of $Rs_1$), $Rs_3B$ (the complementary signal of $Rs_3$), and $R_{01-10}$ (the input signals).

Figure 23:
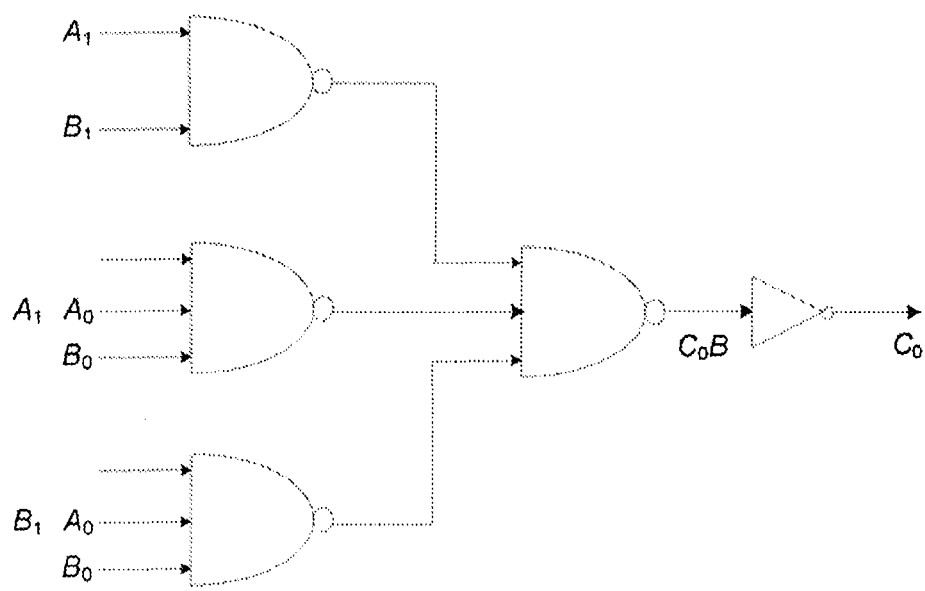
FIG. 23 illustrates an exemplary column decoder of the 4-bits adder used in ROM array 2 as shown in FIG. 20.
Figure 24A:
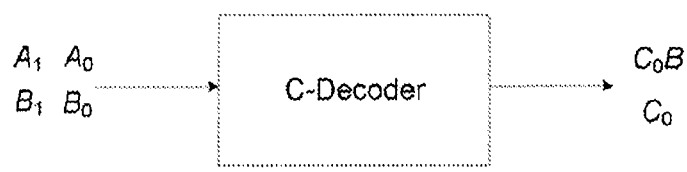
FIG. 24a is a diagram showing a decoding operation for a portion of inputs in the column decoder in FIG. 23.
Figure 24B:
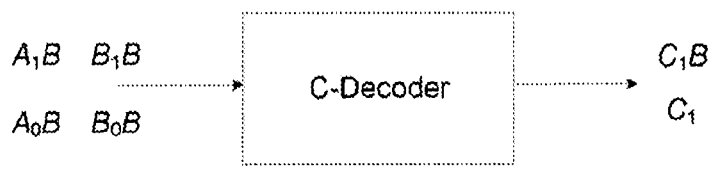
FIG. 24b is a diagram showing a decoding operation for another portion of inputs in the column decoder in FIG. 23.

An exemplary column decoder in ROM array 2 in FIG. 20 is schematically illustrated in FIG. 23. The input signals in this example includes $A_1$ (the $1^{st}$ bit of variable A), $A_1B$ (the complementary signal of $A_1$), $B_1$ (the $1^{st}$ bit of variable B), $B_1B$ (the complementary signal of $B_1$), $A_0$ (the $0^{th}$ bit of variable A), $A_0B$, $B_0$ (the $0^{th}$ bit of variable B), and $B_0B$. The output signals include $C_1$ (a column select signal), $C_1B$ (the complementary signal of $C_1$); $C_0$ (a column select signal), $C_0B$ (the complementary signal of $C_0$). Logic diagrams of the column decoder for generating output signals $C_0$, $C_0B$, $C_1$, and $C_1B$ for input signals $A_1$, $A_0$, $B_1$, and $B_0$; and $A_1B$, $A_0B$, $B_1B$, and $B_0B$ are schematically illustrated in FIG. 24a and FIG. 24b.

Figure 25:
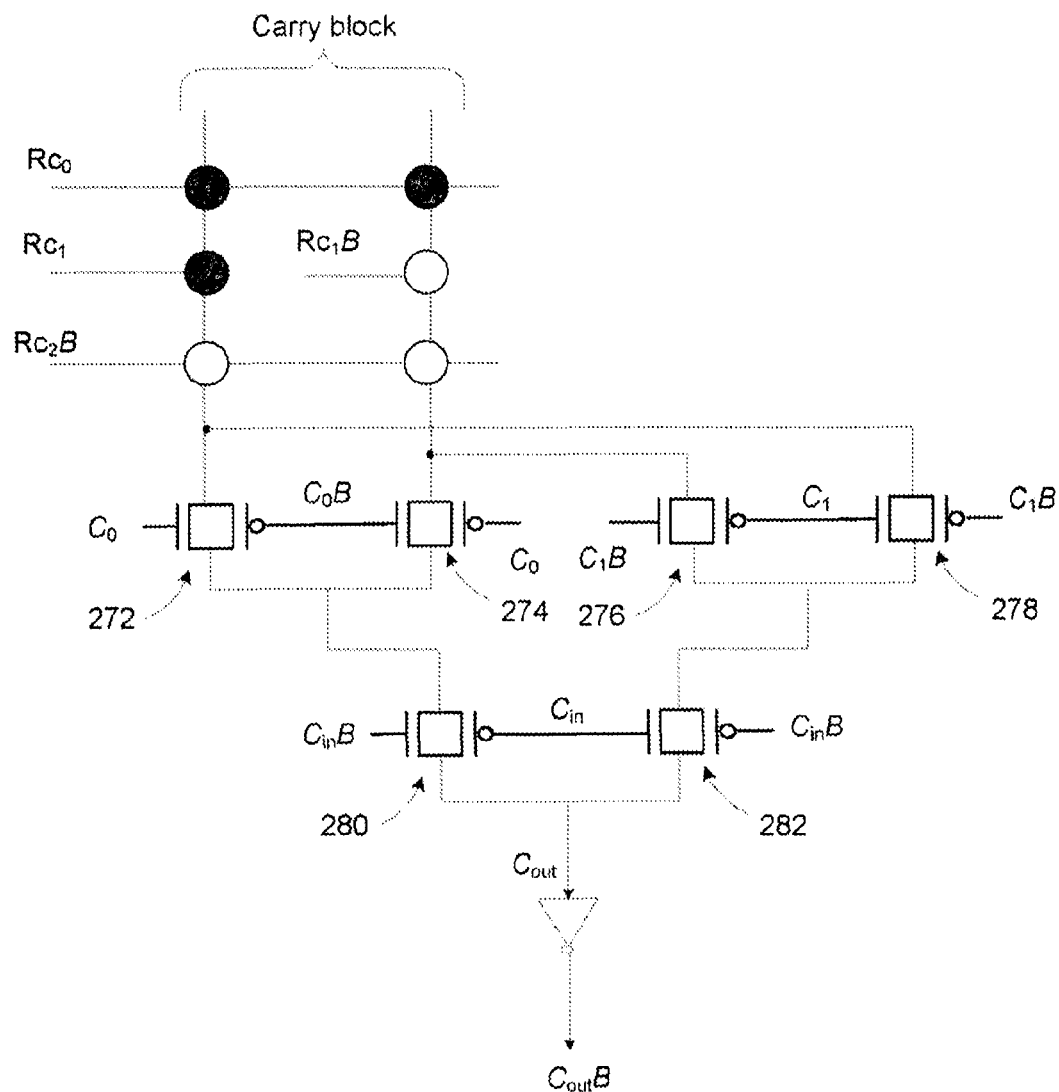
FIG. 25 illustrates an exemplary memory structure of the carry block in the memory block 2 of the 4-bits adder in FIG. 20.

The carry block for obtaining the carry bit of the adder in the memory block 2 of the adder in FIG. 20 is schematically illustrated in FIG. 25. It is noted that the memory cell array of the carry block is after the elimination of repeating memory cell rows and columns as discussed above. With the input signals including $Rc_0$, $Rc_1$, $Rc_1B$, $Rc_2B$, $C_0$, $C_0B$, $C_1$, $C_1B$, $C_{in}$, and $C_{in}B$, the carry block is capable of outputting the carry signal $C_{out}$ and $C_{out}B$.

Figure 26:
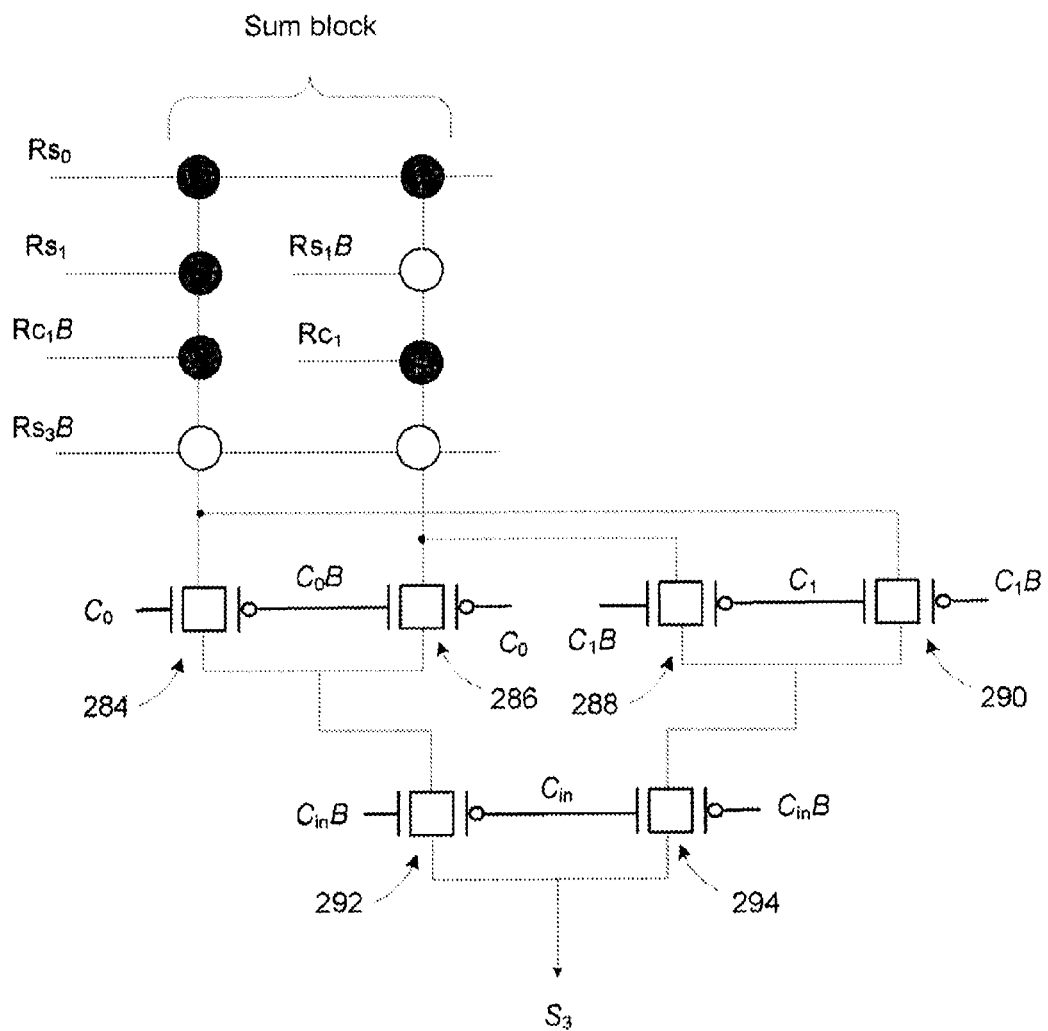
FIG. 26 illustrates an exemplary memory structure of the sum block for obtaining the most-significant bit $S_3$ in the memory block 2 of the 4-bits adder in FIG. 20.

A portion of the sum block of the adder in the memory block 2 of the adder in FIG. 20 for obtaining the $3^{rd}$ bit of the sum is schematically illustrated in FIG. 26. It is noted that the memory cell array of the illustrated memory block is after the elimination of repeating memory cell rows and columns as discussed above. With the input signals including $Rs_0$, $Rs_1$, $Rs_1B$, $Rc_1B$, $Rc_1$, $Rs_3B$, $C_0$, $C_0B$, $C_1$, $C_1B$, $C_{in}$, and $C_{in}B$, the illustrated memory block is capable of outputting the $3^{rd}$ bit $S_3$ of sum for input signals A and B.

Figure 27:
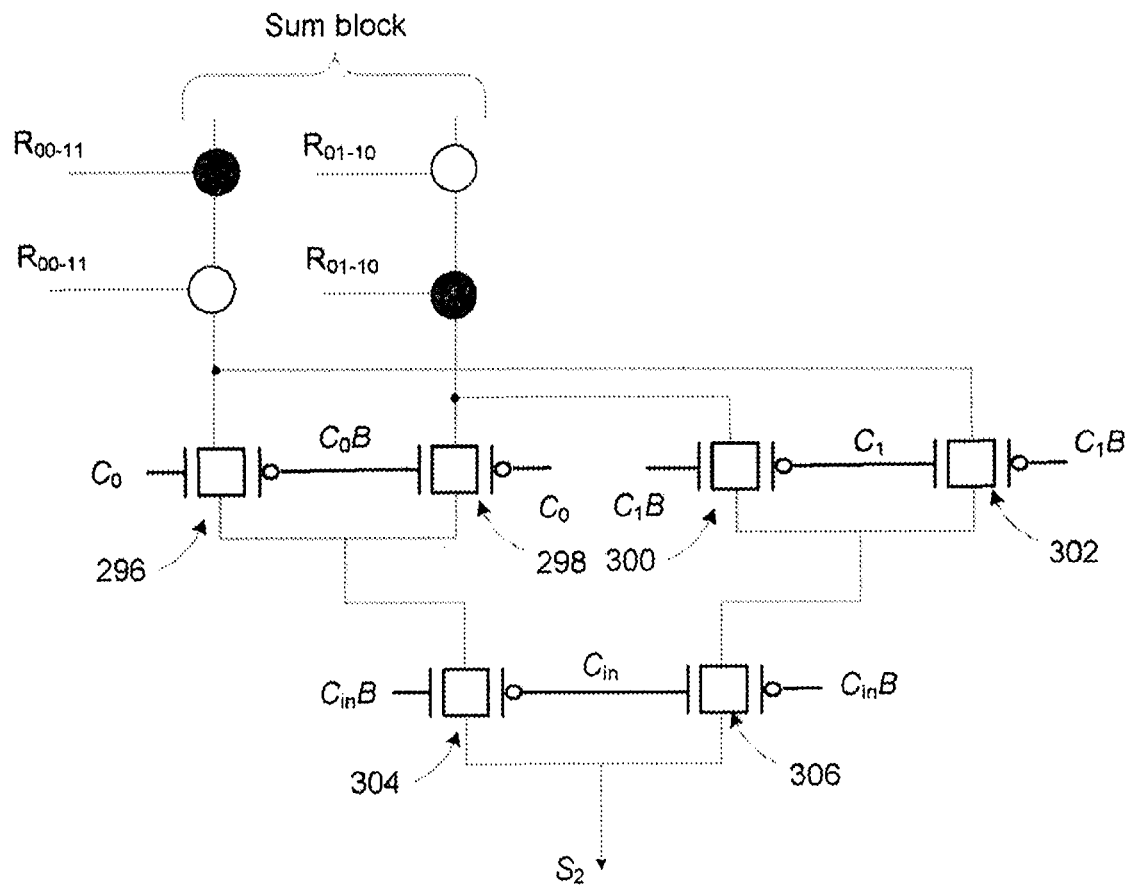
FIG. 27 illustrates an exemplary memory structure of the sum block for obtaining the sum bit $S_2$ in the memory block 2 of the 4-bits adder in FIG. 20.

A portion of the sum block of the adder in the memory block 2 of the adder in FIG. 20 for obtaining the $2^{nd}$ bit of the sum is schematically illustrated in FIG. 27. It is noted that the memory cell array of the illustrated memory block is after the elimination of repeating memory cell rows and columns as discussed above. With the input signals including $R_{00-11}$, $R_{01-10}$, $C_0$, $C_0B$, $C_1$, $C_1B$, $C_{in}$, and $C_{in}B$, the illustrated memory block is capable of outputting the $2^{nd}$ bit $S_2$ of sum for input signals A and B.

Figure 28:
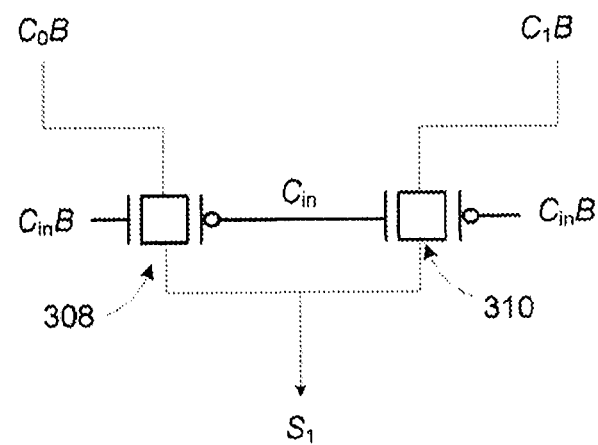
FIG. 28 illustrates an exemplary memory structure of the sum block for obtaining the least-significant bit $S_1$ in the memory block 2 of the 4-bits adder in FIG. 20.

A portion of the sum block of the adder in the memory block 2 of the adder in FIG. 20 for obtaining the $1^{st}$ bit of the sum is schematically illustrated in FIG. 28. With the input signals including $C_0B$, $C_1B$, $C_{in}$, and $C_{in}B$, the illustrated memory block is capable of outputting the $1^{st}$ bit $S_1$ of sum for input signals A and B.

As discussed above, the carry and sum memory blocks are derived from the memory cell arrays by removing repeating memory cells. An exemplary process for removing repeating memory cells of the $5^{th}$ output bit of a ROM based 4×4 multiplier is demonstrated in FIG. 29a through FIG. 29c.

Figures 29A, 29B, 29C:
FIG. 29a through FIG. 29c schematically illustrate a method for dividing the memory array into sub-blocks and then removing redundant rows and columns. The example is taken for a memory array required for the $5^{th}$ output bit of a 4×4 multiplier in ROM based implementation.

Referring to FIG. 29a, a ROM for the $5^{th}$ output bit of a 4×4 multiplier is illustrated therein. The memory array can be simplified by removing identical rows and columns. A reduced memory cell array is illustrated in FIG. 29b. The memory cell array can further be reduced by dividing a memory block into several sub-blocks. Each sub-block then can be optimized following the above identical row/column elimination method. Finally, identical sub-blocks can also be eliminated as shown in FIG. 29b. FIG. 29c demonstrates a resulted memory cell array from the memory cell array illustrated in FIG. 29b by further removing the repeating columns and/or memory blocks. From the above example, it can be seen that a 256 bit memory (original; before any memory optimization) is thus reduced to only 8 bit. It can further be reduced by repeating the above technique.

Figure 30:
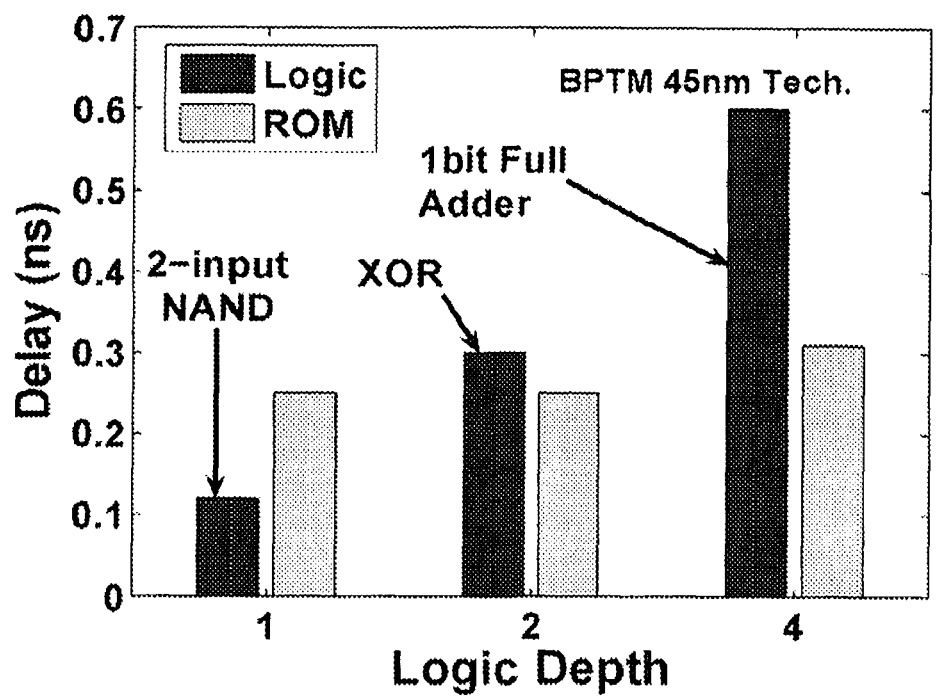
FIG. 30 is a graphical chart that compares delay verses logic depth between conventional (logic) applications and new (ROM) applications according to some examples of this disclosure.

In the following, performances of selected examples of memory based computation systems are demonstrated in graphs. Referring to FIG. 30, delays of an exemplary memory based computation system is compared to its logic circuit counterpart. As can be seen in FIG. 30, delay in the ROM based design is significantly longer at logic depth 1, but is significantly shorter at logic depth 4.

Figure 31:
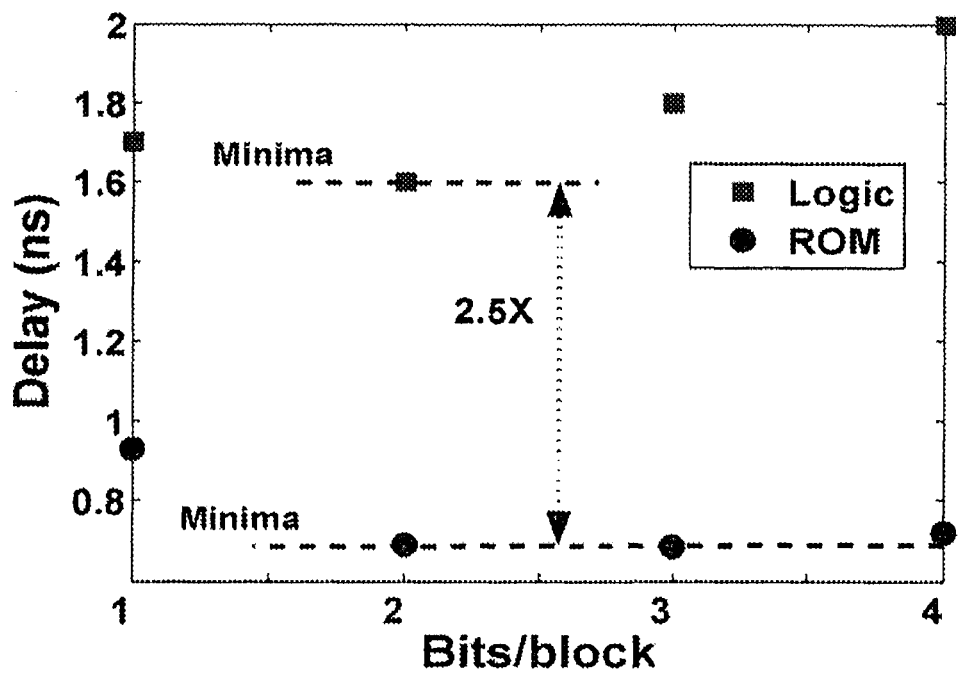
FIG. 31 shows an illustrative and non-limiting example of an optimization result in the case of a 16-bit Carry Select Adder.

An illustrative and non-limiting example of an optimization result in the case of a 16 bit Carry Select Adder is demonstrated in FIG. 31. In this demonstration, both conventional (i.e., designated as logic in FIG. 31) and MBC (i.e., designated as ROM in FIG. 31) implementations were done using Berkeley Predictive Technology Model (BPTM) 45 nm technology and the illustrative and non-limiting exemplary ROM cells were used in the MBC implementation. As shown in FIG. 31, in accordance with the foregoing description, neither the smallest block (e.g., 1 block in FIG. 31) nor the largest block (e.g., 4) with the ROM based design would provide the maximum performance. In an example, however, an optimum number of blocks can be chosen so as to achieve a maximum or closer to a maximum performance. With reference to FIG. 31, it can be seen that in this illustrative example, by optimizing the block size, an MBC implementation can be approximately 2.5× faster than the conventional logic circuits.

Figure 32:
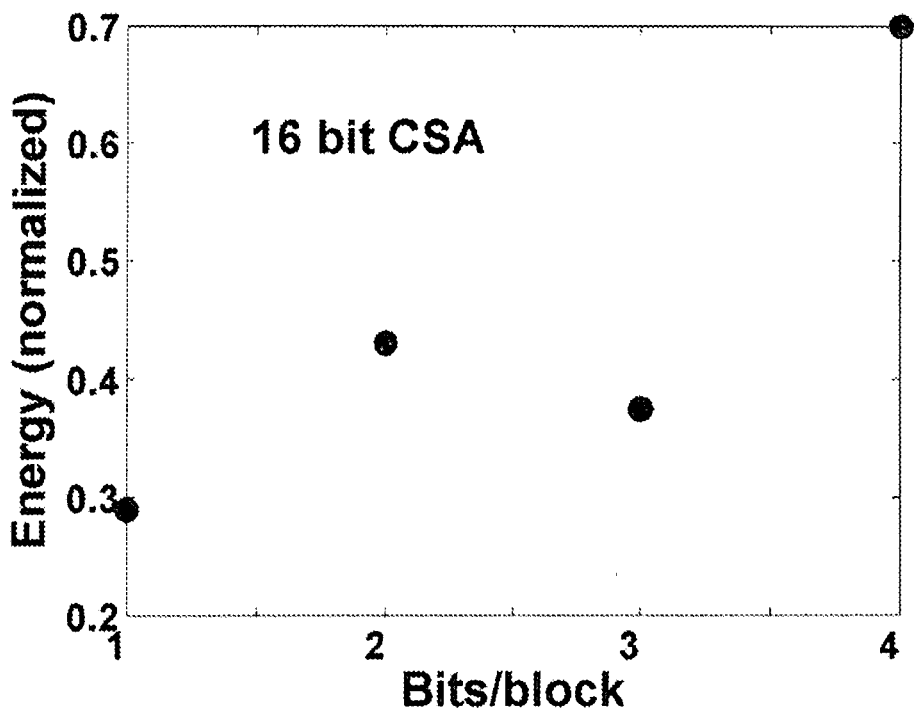
FIG. 32 is a graphical chart demonstrating energy savings (normalized) to different block configurations of the above carry selected adder.

FIG. 32 shows additional aspects related to the illustrative and non-limiting exemplary case of the 16 bit Carry Select Adder discussed above. In this regard, FIG. 32 shows the energy savings (normalized) to different block configurations of the above CSA. In this regard, the normalized result means that the results are normalized to their Complementary Metal-Oxide Semiconductor (CMOS) counterpart. With reference to FIG. 32, the improvement in energy comes largely from a reduction in the number of switching.

Figure 33:
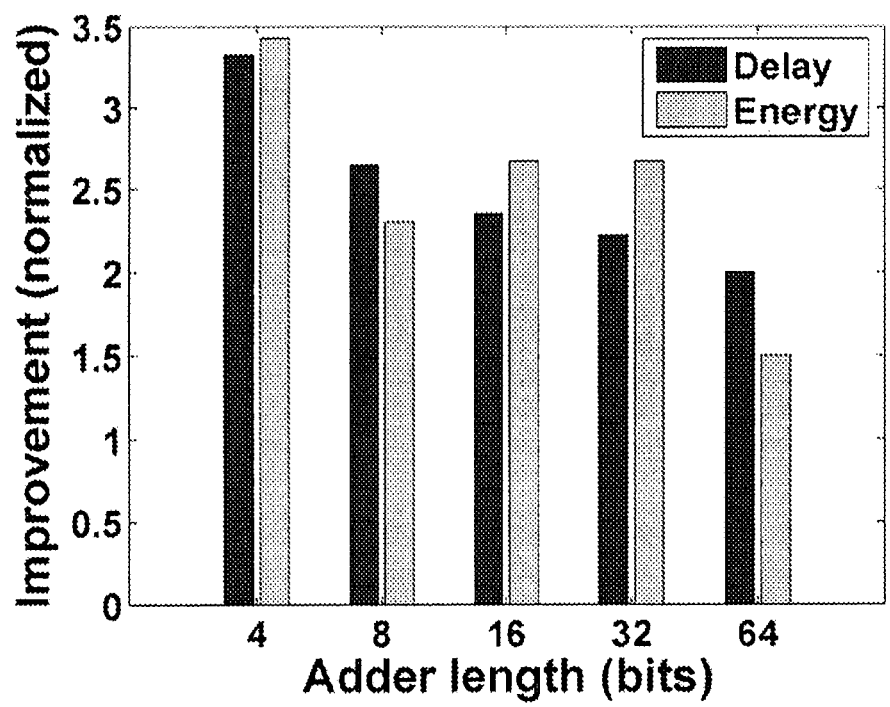
FIG. 33 is a graphical chart demonstrating improvements in delay and energy (normalized) in relation to adder length.

FIG. 33 shows results of further analyses of different adder lengths, demonstrating similar improvements can be achieved. In this regard, FIG. 34 demonstrates improvements in delay and energy (again, normalized) in relation to adder length.

It is noted that the above discussions are for demonstration purposes, and should not be interpreted as a limitation. Other variations without departing from the spirit of the disclosure are also applicable. For example, the memory cells in the memory cell array as illustrated in FIG. 2 can be diodes for storing digital bits "0" and "1," as schematically illustrated in FIG. 34.

Figure 34:
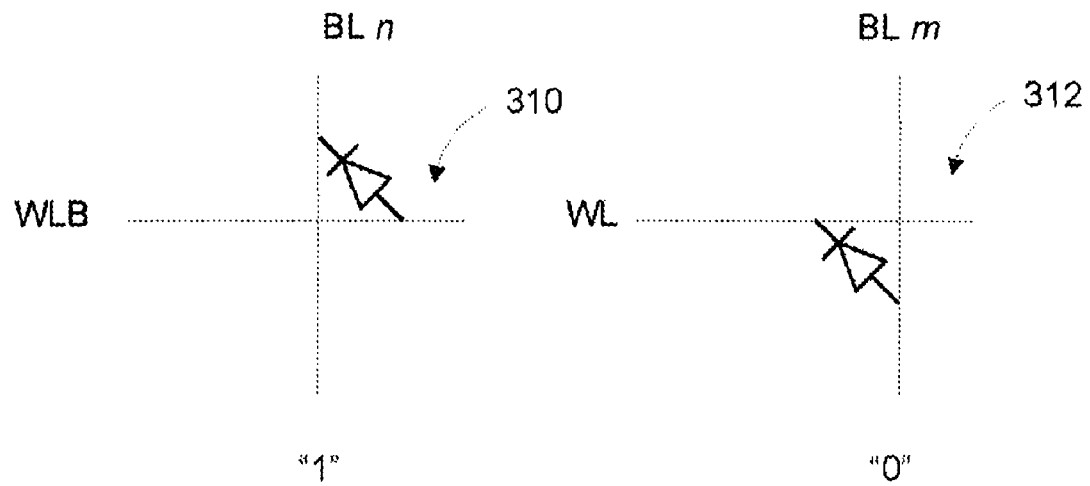
FIG. 34 schematically illustrates diode cells that can be used for the memory cell array in FIG. 2.

Referring to FIG. 34, diode 310 has the anode connected to a complementary wordline signal WLB for accessing the diode and the cathode connected to a bitline signal BL n for reading the content of the diode. Such configuration is referred to a memory node or a memory cell that can be designated to store the digital bit "1." By swapping the connections of the cathode and anode of the diode to the bitline and wordline signals, a memory cell for storing the digital bit "0" can be achieved, as shown in the right panel of FIG. 34. Specifically, diode 312 has the cathode connected to a wordline signal WL for accessing the diode and the anode connected to a bitplane signal BL m for reading the content of the diode. Such configuration can be designated to store the digital bit "0." The voltage signals of the diodes (310 and 312) in response to driving signals (WL and WLB) are schematically illustrated in FIG. 35.

Figure 35:
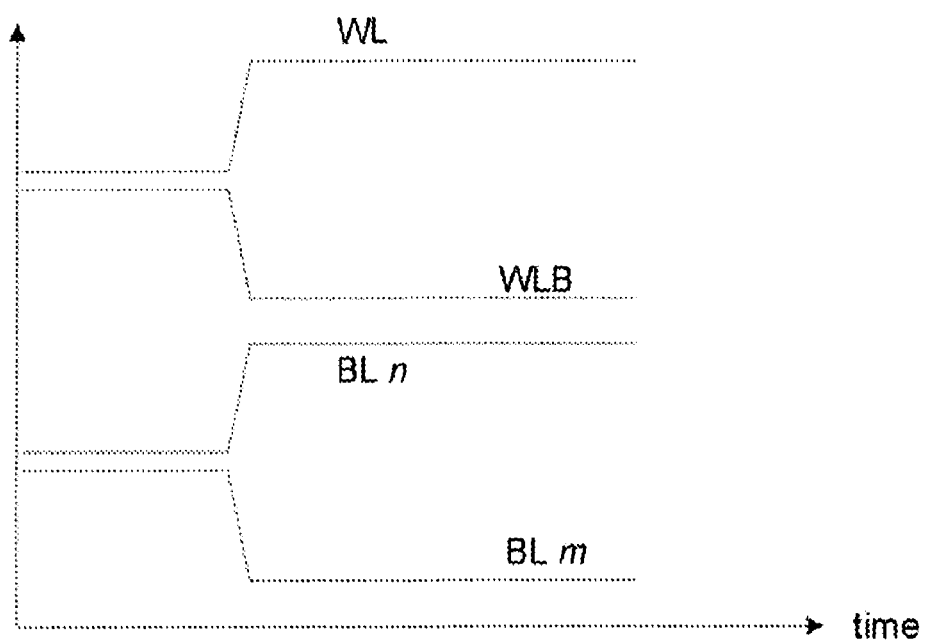
FIG. 35 schematically illustrates voltage signals of the diode cells in FIG. 36 in response to different driving signals.

Referring to FIG. 35, the cathode of diode 310 yields a high voltage (representing "1") when the wordline signal WL is high (the complementary wordline signal WLB is low), resulting in the voltage signal of bitline BL n connected to the cathode of diode 310 to be at a high voltage corresponding to the digital bit "1." The anode of diode 312 yields a low voltage (representing "0") when the wordline signal WL is high (the complementary wordline signal WLB is low), resulting in the voltage signal of bitline BL m connected to the anode of diode 312 to be at a low voltage corresponding to the digital bit "0."

Figure 36:
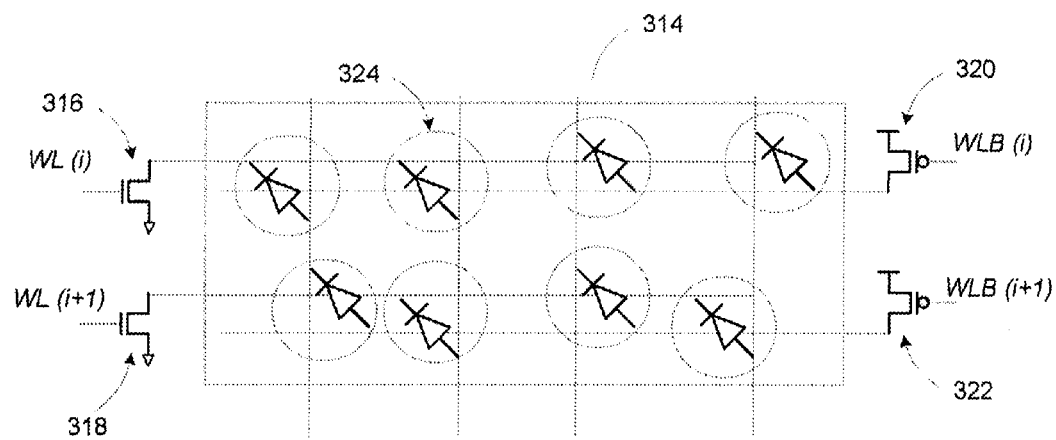
FIG. 36 schematically illustrates an exemplary memory cell array composed of diode cells illustrated in FIG. 35.

An exemplary method for providing the wordline signal and complementary wordline signal for a memory cell array composed of the diodes shown in FIG. 35 is schematically illustrated in FIG. 36.

Referring to FIG. 36, each memory cell (e.g. memory cell 324) of memory cell array 314 comprises a diode. The memory cells storing "1" have the diode whose anodes are connected to complementary wordline signals and cathodes are connected to bitline signals; while the memory cells storing "0" having the diodes whose anodes are connected to bitline signals and cathodes are connected to wordline signals. The wordline signals WL and their complementary wordline signals WLB are generated by row decoders and subsequently a row is accessed through access transistors NMOS (316 and 318) transistors or PMOS transistors (320 and 322), as shown in the figure. Specifically, all diodes storing "0" in the $i^{th}$ row have their cathodes connected to the drain of NMOS transistor 316; and all diodes storing "1" in the $i^{th}$ row have their anodes connected to the drain of PMOS transistor 320. Similarly, all diodes storing "0" in the $(i+1)^{th}$ row have their cathodes connected to the drain of NMOS transistor 318; and all diodes in storing "1" in the $(i+1)^{th}$ row have their anodes connected to the drain of PMOS transistor 322. When a particular row is selected, bitlines storing '0' are discharged through the NMOS access transistor and bit-lines that store '1' are charged through the PMOS access transistor. Though as shown in FIG. 36 only one NMOS and one PMOS transistors are used per row, they can however, be distributed based on the actual memory size and access time requirement. In another example, each bitline can be connected to an inverter for improving drivability, as schematically illustrated in FIG. 37.

Figure 37:
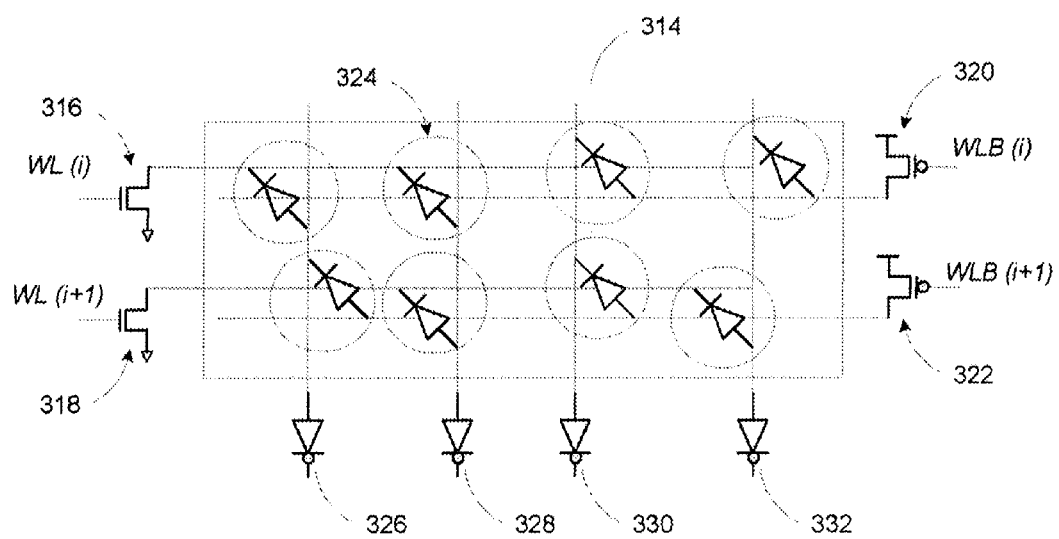
FIG. 37 schematically illustrates another exemplary memory cell array composed of diode cells illustrated in FIG. 35.

Referring to FIG. 37, inverters 326, 328, 330, and 332 are connected to the bitlines of the memory cell array 314. These driving inverters further can be rearranged based on the column decoder circuitry and the load. For example, the inverters can be used before or after column select pass/transmission gate depending on a specific design requirement.

FIG. 38a through FIG. 41c schematically illustrate exemplary diode structures that can be used for the diode based memory cells as discussed above. Specifically, FIG. 38a schematically illustrates a traditional PN junction; and FIG. 38b illustrates a traditional Schottky (metal-semiconductor) junction (MN junction, wherein "M" represents a metal). A MOSFET based diode is schematically illustrated in FIG. 38c. FIG. 39a schematically illustrates a traditional $P^+N$ junction, wherein $P^+$ represents a heavy doped P area; and FIG. 39b illustrates a traditional Schottky (metal-semiconductor) junction ($MN^+$ junction, wherein $N^+$ represents a heavy doped N area). An equivalent MOSFET based diode is schematically illustrated in FIG. 39c. FIG. 40a schematically illustrates a traditional $PN^+$ junction; and FIG. 40b illustrates a traditional Schottky (metal-semiconductor) junction (MP junction). An equivalent MOSFET based diode is schematically illustrated in FIG. 40c. FIG. 41a schematically illustrates a traditional $P^+N^+$ junction; and FIG. 41b illustrates a traditional Schottky (metal-semiconductor) junction ($MP^+$ junction). An equivalent MOSFET based diode is schematically illustrated in FIG. 41c.

Figure 42:
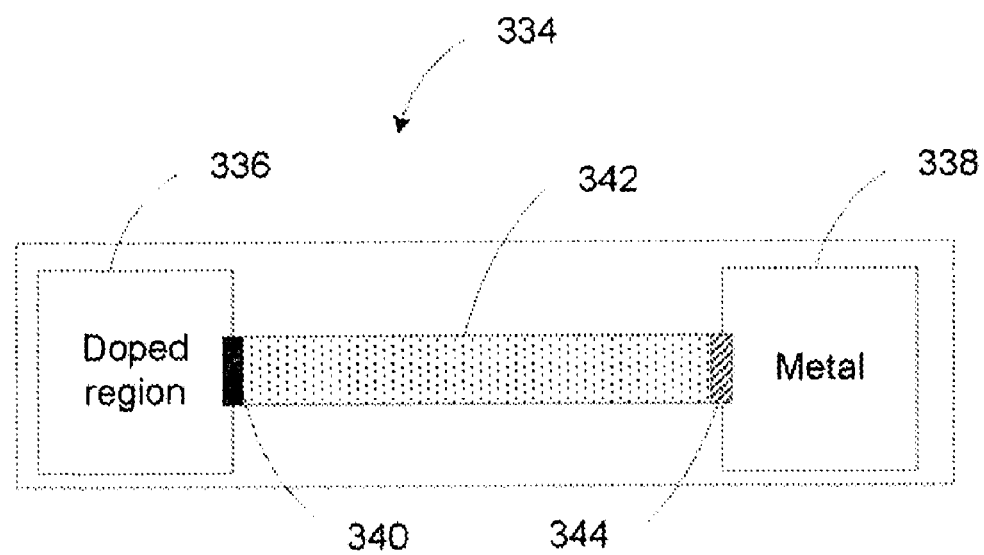
FIG. 42 schematically illustrates a cross-sectional view of an exemplary nanowire diode that can be used in the memory cell array illustrated in FIG. 2.
Figure 43:
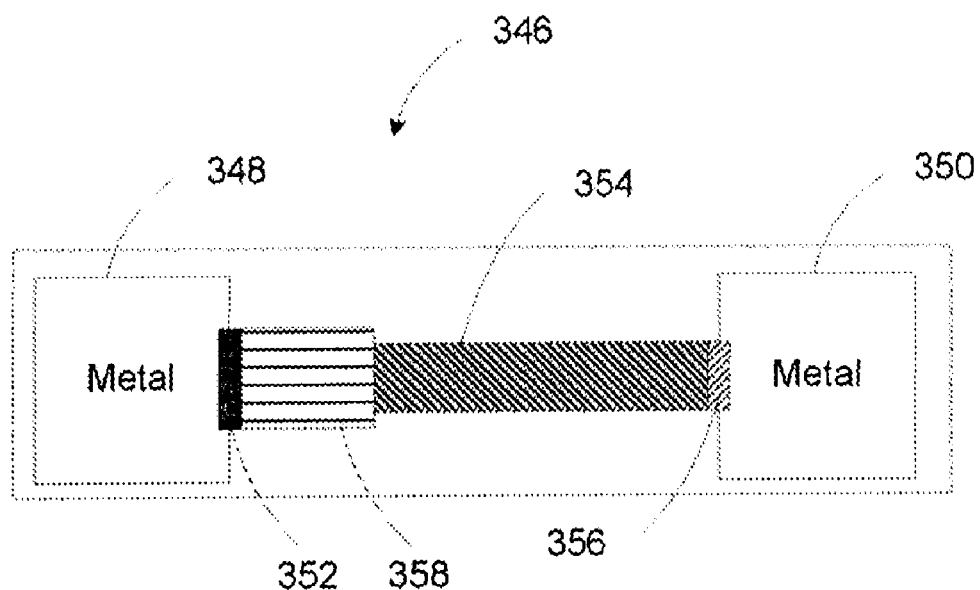
FIG. 43 schematically illustrates a cross-sectional view of an exemplary carbon-nanotube diode that can be used in the memory cell array illustrated in FIG. 2.

In addition to the diodes as discussed above with reference to FIG. 38a through FIG. 41c, other diodes are also applicable, examples of which are schematically illustrated in FIG. 42 and FIG. 43. Referring to FIG. 42, an exemplary nanowire diode is schematically illustrated in a cross-sectional view. In this example, nanowire diode 334 comprises doped region 336 that has abundant charge carriers (e.g. electrons or holes), such as a P, $P^+$, N, and $N^+$ area. The doped region is connected to one end of semiconductor nanowire 342 through ohmic contact 340. The semiconductor nanowire can be a P type or N type, or any equivalencies thereof, such as $P^+$, type and $N^+$ type, semiconductor nanowires. The other end of the semiconductor nanowire is connected to metal region (338) through Schottky contact 344. Many different materials such as silicon and germanium can be used with various metals to develop the Schottky contact between the semiconductor nanowire and metal (338). In other possible examples, the semiconductor nanowire (342) can be replaced by other suitable materials, such as carbon nanotubes, an example of which is set forth in SCIENCE, Vol. 292, pp. 706-709, 2001, the subject matter of which is incorporated herein by reference in its entirety. In this instance, the Schottky contact can be accomplished by making one side of the carbon nanotube heavily doped.

FIG. 43 schematically illustrates an exemplary carbon nanotube based diode that can be used in the memory cell of the memory cell array as illustrated in FIG. 2. Referring to FIG. 43, carbon nanotube based diode 346 comprises first metal region 348 exhibiting metallic properties (e.g. abundant electrons). The first metal region (348) is connected to metallic carbon nanotube (CNT) 358 through ohmic contact 352. The metallic carbon nanotube (358) is connected to one end of semiconductor carbon nanotube 354 that can be a P or N type or other types of semiconductor carbon nanotubes. The other end of the semiconductor carbon nanotube (354) is connected to metal region 350 through Schottky contact 356. The Schottky contact (356) in carbon nanotube can be accomplished by using multi-walled metallic nanotube and removing the outer layers from one side while keeping only the innermost semiconducting nanotube.

It will be appreciated by those of skill in the art that a new and useful memory based computation systems and methods of using the same have been described herein. In view of the many possible embodiments, however, it should be recognized that the embodiments described herein with respect to the drawing figures are meant to be illustrative only and should not be taken as limiting the scope of what is claimed. Those of skill in the art will recognize that the illustrated embodiments can be modified in arrangement and detail. Therefore, the devices and methods as described herein contemplate all such embodiments as may come within the scope of the following claims and equivalents thereof.

I claim:

1. A logic device, comprising:
   an array of memory cells each having a diode;
   a first wordline connected to the cathodes of the diodes in a row of the array;
   a second wordline connected to the anodes of the diodes in said row of the array;
   a first set of bitlines connected to the anodes of the diodes whose cathodes are connected to the first wordline;
   a second set of bitlines connected to the cathodes of the diodes whose anodes are connected to the second wordline; and
   wherein the diodes connected to the first wordline and the first set of bitlines store therein a digital bit "0;" and the diodes connected to the second wordline and the second set of bitlines store therein a digital bit "1" such that an output of the memory cell array corresponds to a logic function of a collection of a plurality of input signals that are connected to the memory cells for accessing the memory cells.

2. The logic device of claim 1, wherein the memory cell array further comprises a plurality of functional sub-blocks such that an output of each sub-block corresponds to a portion of said combination of the plurality of input signals.

3. The logic device of claim 1, wherein said memory cell array has substantially no identical rows or columns or substantially no rows or columns that follow the same pattern.

4. The logic device of claim 1, wherein the diode is a P-N junction.

5. The logic device of claim 1, wherein the diode is a nanowire based diode or a carbon-nanotube based diode.

6. The logic device of claim 1, wherein the diode is composed of a metal region and a semiconductor region that is a P type, P$^+$ type, N type, or N$^+$ type.

7. The logic device of claim 1, wherein the logic function has a logic depth of 2 or larger.

8. The logic device of claim 1, wherein the data stored in a memory cell corresponds to a bit of a multiplier of a combination of the input signals.

9. The logic device of claim 1, wherein the data stored in a memory cell corresponds to a bit of a FFT compiler of a combination of the input signals.

10. The logic device of claim 1, wherein the data stored in a memory cell corresponds to a bit of a FIR filter of a combination of the input signals.

11. A logic device, comprising:
    an array of read-only-memory cells each storing a data bit such that a collection of the data bits corresponding to a combination of a plurality of input signals that address the memory cells;
    wherein said memory cell array has substantially no identical rows or columns; and
    wherein the memory cell array further comprises a plurality of functional sub-blocks such that an output of each sub-block corresponds to a portion of said combination of the plurality of input signals, wherein each memory cell comprises a diode.

12. The logic device of claim 11, wherein each memory cell comprises an NMOS or a PMOS transistor.

13. The logic device of claim 11, wherein the diode is a nanowire based diode or a carbon-nanotube based diode.

14. The logic device of claim 11, further comprising:
    a first wordline connected to the cathodes of the diodes in a row of the array;
    a second wordline connected to the anodes of the diodes in said row of the array;
    a first set of bitlines connected to the anodes of the diodes whose cathodes are connected to the first wordline; and
    a second set of bitlines connected to the cathodes of the diodes whose anodes are connected to the second wordline; and
    wherein the diodes connected to the first wordline and the first set of bitlines store therein a digital bit "0;" and the diodes connected to the second wordline and the second set of bitlines store therein a digital bit "1."

15. The logic device of claim 14, wherein the first wordline is connected to a drain of an NMOS transistor; and the second wordline is connected to a source of a PMOS transistor.

16. A logic device, comprising:
    an array of read-only-memory cells each storing a data bit such that a collection of the data bits corresponding to a combination of a plurality of input signals that address the memory cells;
    wherein said memory cell array has substantially no identical rows or columns;
    wherein the memory cell array further comprises a plurality of functional sub-blocks such that an output of each sub-block corresponds to a portion of said combination of the plurality of input signals;
    wherein each memory cell comprises an NMOS or a PMOS transistor;
    wherein the NMOS transistors store logic bit "0" and the PMOS transistors store logic bit "1;" and
    wherein the NMOS transistors of the cells in a row of the array are connected to a first wordline in said row;
    wherein the PMOS transistors of the cells in said row of the array are connected to a second wordline in said row; wherein the first and second wordlines are separate wordlines.

17. A method for providing a logic circuit for high performance and low power operations, comprising:
    providing an array of memory cells each storing a data bit such that a collection of the data bits corresponding to a combination of a plurality of input signals;
    reducing the size of the memory cell array, comprising:
        removing the memory cells whose stored data bits follow the same pattern in the array;
    connecting the memory cells to a plurality of wordlines for accessing the memory cells; and
    connecting the memory cells to a plurality of bitlines for reading a plurality of contents from the memory cells connected to said plurality of bitlines.

18. The method of claim 17, wherein the step of removing the memory cells whose stored data bits follow the same pattern comprises:
    identifying a group of identical rows or columns in the array;
    selecting one of the identical rows or columns; and
    removing the other identical rows or columns and leaving said selected one of the identical rows or columns.

19. The method of claim 17, wherein the step of reducing the size of the memory cell array further comprises:
    dividing the memory cell array into a plurality of sub-blocks; and
    removing the memory cells whose stored data bits in each sub-block follow the same pattern in said each sub-block.

20. The method of claim 17, wherein the step of reducing the size of the memory cell array further comprises:
    removing a row or a column of memory cells stored therein the same digital bit.

* * * * *